United States Patent [19]
Mishima et al.

[11] Patent Number: 5,990,963
[45] Date of Patent: Nov. 23, 1999

[54] ENCODER AND DECODER

[75] Inventors: Hidetoshi Mishima; Takashi Itow, both of Kyoto-Fu, Japan

[73] Assignee: Mitsubishi Denki Kabushiki Kaisha, Tokyo, Japan

[21] Appl. No.: 09/093,639

[22] Filed: Jun. 9, 1998

Related U.S. Application Data

[62] Division of application No. 08/919,784, Aug. 29, 1997, Pat. No. 5,793,432, which is a division of application No. 08/555,170, Nov. 8, 1995, Pat. No. 5,734,430, which is a division of application No. 07/938,231, filed as application No. PCT/JP92/00432, Apr. 7, 1992, Pat. No. 5,488,418.

[30] Foreign Application Priority Data

| Apr. 10, 1991 | [JP] | Japan | 3-077686 |
| Mar. 6, 1992 | [JP] | Japan | 4-049483 |
| Mar. 10, 1992 | [JP] | Japan | 4-051466 |
| Apr. 7, 1992 | [WO] | WIPO | PCT/JP92/00432 |

[51] Int. Cl.⁶ .............................. H04N 7/36; H04N 7/50
[52] U.S. Cl. .............. 348/420; 348/423; 348/466; 348/845.1; 370/471; 371/2.1; 375/246; 375/253
[58] Field of Search ................... 348/10–14, 845.1, 348/390, 398, 403, 406, 409, 415, 420, 423, 429, 463, 467, 473, 489, 466; 386/111, 116; 371/2.1; 341/65, 67; 375/246, 253; 370/470, 471, 472; H04N 7/36, 7/50

[56] References Cited

U.S. PATENT DOCUMENTS

| 4,734,768 | 3/1988 | Pexa | 348/415 |
| 4,839,724 | 6/1989 | Kessen | 370/472 |
| 5,036,391 | 7/1991 | Auvray | 348/420 |
| 5,218,622 | 6/1993 | Fazel et al. . | |
| 5,227,876 | 7/1993 | Cucci | 370/471 |
| 5,233,348 | 8/1993 | Pollmann et al. | 341/67 |
| 5,239,308 | 8/1993 | Keesen . | |
| 5,337,087 | 8/1994 | Mishima . | |
| 5,479,264 | 12/1995 | Ueda et al. . | |
| 5,488,482 | 1/1996 | Ueda et al. . | |

FOREIGN PATENT DOCUMENTS

| 0345872 | 12/1989 | European Pat. Off. . |
| 0367264 | 5/1990 | European Pat. Off. . |
| 9102430 | 8/1990 | European Pat. Off. . |
| 0436251 | 7/1991 | European Pat. Off. . |
| 9208289 | 10/1991 | European Pat. Off. . |
| 49-29929 | 3/1974 | Japan . |
| 58-218255 | 12/1983 | Japan . |
| 63-260271 | 10/1988 | Japan . |
| 1-141483 | 2/1989 | Japan . |

OTHER PUBLICATIONS

IEEE Transactions on Information Theory, vol. IT–22, No. 4, Jul. 1976.
Paper entitled "Criteria for the Protection of the Video Information in a Codec Based on DCT"; Signal Processing of HDTV, II; Proceedings of the Third International Workshop on HDTV, Turin Italy (Aug. 30, 1989–Sep. 1, 1989); pp. 769–776.
"Information Technology—Coding of moving pictures and associated audio for digital storage media at up to about 1, 5 Mbit/s" Part 2: Video; International Standard; ISO/IEC 11172–2; 1993; pp. 1–38.
Nikkei Electronics; Oct. 15, 1990; Unix; pp. 116–147.
"A Consideration on Filters in the Coding Loop of Hybrid MC/DCT Coding Scheme"; IE86–100, Feb. 26, 1987; pp. 17–23.

*Primary Examiner*—Bryan Tung
*Assistant Examiner*—Nhon T Diep

[57] ABSTRACT

An encoder which counts the length of a data produced by the variable-length encoding, and time-division-multiplexes information of the data length to the variable-length encoded data. An encoder which time-division-multiplexes information of the number of bits after a fixed partition used in the error-correction encoding to the initial bit of a variable-length code to a variable-length encoded data, and transmits them. An encoder which, when a variable-length code for one symbol of the variable-length encoding extends over a partition used in the error-correction encoding, inserts a special code before the partition, or guarantees that the top of the partition is always at the top of the variable-length code. An encoder which obtains the sum of fields and the difference between fields, and performs on these values the orthogonal transform to encode them.

1 Claim, 50 Drawing Sheets

Fig. 1 (A) PRIOR ART
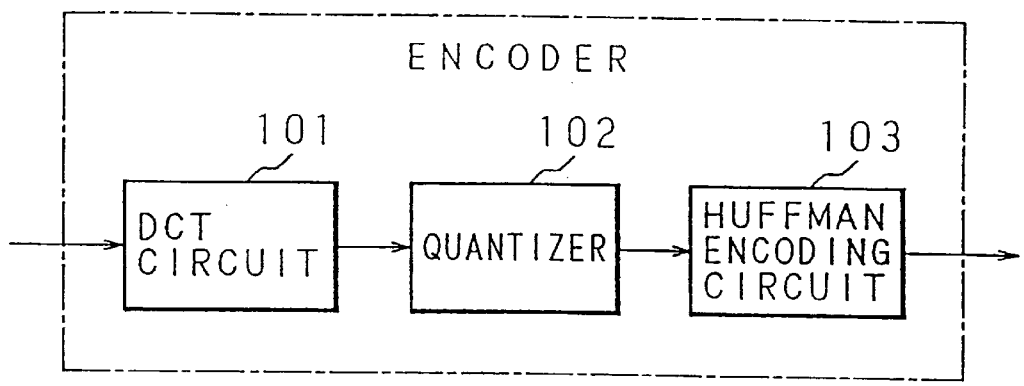
Fig. 1 (B) PRIOR ART
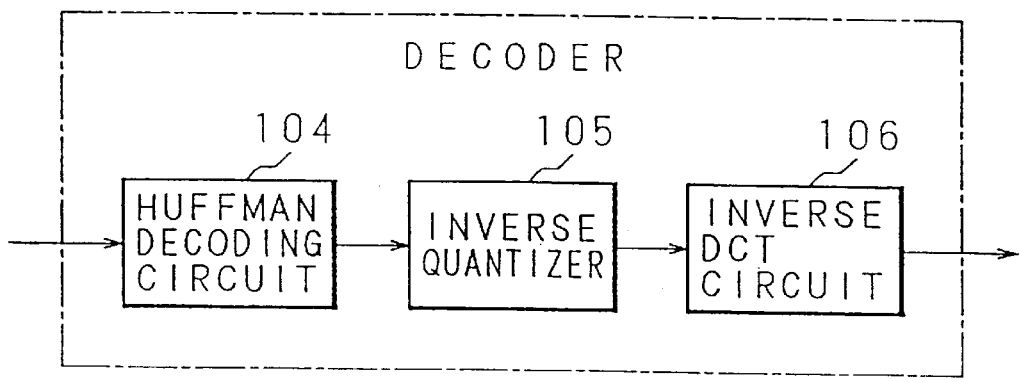

Fig. 2 PRIOR ART

| d11 | d12 | d13 | d14 | d15 | d16 | d17 | d18 |
|---|---|---|---|---|---|---|---|
| d21 | d22 | d23 | d24 | d25 | d26 | d27 | d28 |
| d31 | d32 | d33 | d34 | d35 | d36 | d37 | d38 |
| d41 | d42 | d43 | d44 | d45 | d46 | d47 | d48 |
| d51 | d52 | d53 | d54 | d55 | d56 | d57 | d58 |
| d61 | d62 | d63 | d64 | d65 | d66 | d67 | d68 |
| d71 | d72 | d73 | d74 | d75 | d76 | d77 | d78 |
| d81 | d82 | d83 | d84 | d85 | d86 | d87 | d88 |

Fig. 4 PRIOR ART

| 120 | 1 | 1 | 1 | 3 | 7 | 15 | 10 |
|---|---|---|---|---|---|---|---|
| 2 | 0 | 0 | 0 | 1 | 4 | 16 | 0 |
| 0 | 0 | 0 | 0 | 0 | 0 | 1 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

Fig. 5 PRIOR ART

| (RUN-LENGTH, VALUE) | AFTER ENCODING |
|---|---|
| ( 0 . 1 ) | 11 |
| ( 0 . 2 ) | 000 |
| ( 2 . 1 ) | 00110 |
| ( 0 . 1 ) | 11 |
| ( 7 . 3 ) | 001000111000000011 |
| ( 0 . 7 ) | 01110 |
| ( 0 . 1 ) | 11 |
| ( 9 . 4 ) | 001000100100000100 |
| ( 0 . 15) | 10110101 |
| ( 0 . 10) | 011001 |
| ( 0 . 16) | 10111010 |
| (11. 1 ) | 101110111 |
| E O B | 10110111 |

Fig. 6 PRIOR ART

| (RUN-LENGTH . VALUE) | AFTER ENCODING | DATA-LENGTH |
|---|---|---|
| ( 0 . 1 ) | 11 | 2 |
| ( 0 . 2 ) | 000 | 3 |
| ( 0 . 5 ) | 10101 | 5 |
| ( 0 . 7 ) | 01110 | 5 |
| ( 2 . 1 ) | 00110 | 5 |
| ( 5 . 1 ) | 011011 | 6 |
| ( 7 . 3 ) | 001000011100000011 | 18 |
| ( 9 . 4 ) | 001000100100000100 | 18 |
| (11 . 1 ) | 101110111 | 9 |
| E O B | 10110111 | 8 |

Fig. 7 PRIOR ART $$\begin{pmatrix} \text{RUN-} \\ \text{LENGTH} \end{pmatrix}$$

| 120 | 1 | 1 | 1 | 3 | 7 | 15 | 10 |
|---|---|---|---|---|---|---|---|
| 2 | 0 | 0 | 0 | 1 | 4 | 1 | |
| 0 | 0 | 0 | 0 | 0 | 1 | | |
| 0 | 0 | 0 | 0 | 5 | 1 | | |
| 0 | 0 | 0 | 7 | 0 | | | |
| 0 | 0 | 1 | 0 | | | | |
| 0 | 1 | 0 | | | | | |
| 0 | 0 | | | | | | |

INSERTION OF ANOTHER IMAGE FROM THIS FRAME

| SYMBOL | CODE |
|--------|------|
| A | 1 |
| B | 01 |
| C | 001 |
| D | 0001 |
| E | 00001 |
| F | 000001 |
| DUMMY | 000000 |

Fig. 39(A)

| A | B | C |
|---|---|---|
| D | E | F |
| G | H | J |

Fig. 39(B)

| $C_{11}$ | $C_{12}$ | $C_{13}$ | $C_{14}$ | $C_{15}$ | $C_{16}$ | $C_{17}$ | $C_{18}$ |
|---|---|---|---|---|---|---|---|
| $C_{21}$ | $C_{22}$ | $C_{23}$ | $C_{24}$ | $C_{25}$ | $C_{26}$ | $C_{27}$ | $C_{28}$ |
| $C_{31}$ | $C_{32}$ | $C_{33}$ | $C_{34}$ | $C_{35}$ | $C_{36}$ | $C_{37}$ | $C_{38}$ |
| $C_{41}$ | $C_{42}$ | $C_{43}$ | $C_{44}$ | $C_{45}$ | $C_{46}$ | $C_{47}$ | $C_{48}$ |
| $C_{51}$ | $C_{52}$ | $C_{53}$ | $C_{54}$ | $C_{55}$ | $C_{56}$ | $C_{57}$ | $C_{58}$ |
| $C_{61}$ | $C_{62}$ | $C_{63}$ | $C_{64}$ | $C_{65}$ | $C_{66}$ | $C_{67}$ | $C_{68}$ |
| $C_{71}$ | $C_{72}$ | $C_{73}$ | $C_{74}$ | $C_{75}$ | $C_{76}$ | $C_{77}$ | $C_{78}$ |
| $C_{81}$ | $C_{82}$ | $C_{83}$ | $C_{84}$ | $C_{85}$ | $C_{86}$ | $C_{87}$ | $C_{88}$ |

Fig. 47

| 100 | -40 | 0 | 3 | 0 | 1 | 0 | 1 |
|---|---|---|---|---|---|---|---|
| -2 | 0 | 2 | 0 | -1 | 0 | 0 | 0 |
| 0 | 0 | 0 | 0 | 0 | 0 | 0 | 0 |
| -2 | 0 | 3 | 0 | -1 | 0 | 0 | 0 |
| 0 | 0 | 0 | 0 | 0 | 0 | 0 | 0 |
| -3 | 0 | 3 | 0 | -1 | 0 | 0 | 0 |
| 0 | 0 | 0 | 0 | 0 | 0 | 0 | 0 |
| -8 | 0 | 9 | 0 | -3 | 0 | 0 | 0 |

DCT COEFFICIENT OF IN-FRAME BLOCKING

MSE=12.5

Fig. 48

| 100 | -40 | 0 | 3 | 0 | 1 | 0 | 1 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

SUM OF DCT COEFFICIENTS

| -12 | 0 | 12 | 0 | -4 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

DIFFERENCE BETWEEN DCT COEFFICIENTS

MSE=8.9

Fig. 52

| a | b | ODD-FIELD DATA | EVEN-FIELD DATA |
|---|---|---|---|
| OPTIONAL NUMBER | POSITIVE ODD | $a+b$ | $a$ |
| OPTIONAL NUMBER | NEGATIVE ODD | $a$ | $a-b$ |
| OPTIONAL NUMBER | EVEN | $a+\dfrac{b}{2}$ | $a-\dfrac{b}{2}$ |

ENCODER AND DECODER

This application is a divisional application of Ser. No. 08/919,784 filed Aug. 29, 1997 now U.S. Pat. No. 5,793,432, which is a divisional application of Ser. No. 08/555,170 filed on Nov. 8, 1995 now U.S. Pat. No. 5,734,430, which is a divisional application of Ser. No. 07/938,231, filed on Dec. 3, 1992, filed as PCT/JP92/00432 on Apr. 7, 1992 and allowed on Aug. 8, 1995 and issued on Jan. 30, 1996 with U.S. Pat. No. 5,488,418, the entire contents of which are hereby incorporated by reference.

FIELD OF THE INVENTION

This invention relates to an encoder for encoding a video signal used in a television system or the like, and to a decoder for decoding encoded data which is recorded on a recording medium.

DESCRIPTION OF RELATED ART

When a video signal of a dynamic image such as a television signal is transmitted at a low bit rate, discrete cosine transformation (DCT) is generally used. For example, the DCT is employed in the draft recommendation of September, 1990 in MPEG (Moving Picture Experts Group) of the International Standards Organization (abbreviated as ISO). The MPEG further intends to use Huffman coding, which is a kind of the variable-length encoding, so that information to be transmitted is compressed by a combination of the DCT and the variable-length encoding.

In this variable-length encoding method, however, when an error occurs once, the error may propagate over blocks of the DCT. Since error-correcting codes are generally added, such an error will not undoubtedly occur. However, in a transmission channel such as in a digital VTR in which first errors occur relatively frequently, for example, burst errors can occur in a degree exceeding the error correction capability. In such a case, there arises a problem in that the error propagation spreads over the blocks. An example of such a case will be described below.

FIGS. 1(A) and 1(B) are block diagrams illustrating the configuration of a conventional encoder and decoder. The encoder has a DCT circuit 101 which performs the DCT on each block, a quantizer 102 which quantizes transformed coefficients from the DCT circuit 101, and a Huffman encoding circuit 103 which performs the Huffman encoding on the output of the quantizer 102. The decoder comprises a Huffman decoding circuit 104 which performs the Huffman decoding on input data, an inverse quantizer 105 which performs the inverse quantization on the output of the Huffman decoding circuit 104, and an inverse DCT circuit 106 which performs the inverse DCT on the output of the inverse quantizer 105.

The operation will be specifically described. It is assumed that, for example, results obtained by the blocking of 8×8 pixels and the transform in the DCT circuit 101 are arranged as shown in FIG. 2. The results are subjected to the run-length encoding by scanning them in a zig-zag manner as shown in FIG. 3. In a case of a specific example of data shown in FIG. 4, for example, these data are transformed by the run-length encoding into the data shown in the left side of FIG. 5. When subjected to the Huffman encoding using the Huffman encoding table shown in FIG. 6, these are transformed into codes having various code lengths as shown in the right side of FIG. 5. In general, after the blocking process, added is a data which is called EOB (End of Block) and indicates the end of a block.

Next, the manner of performing a decoding operation in a case will be described, for example, wherein a 1-bit error occurs in the data of 10111010 having the run-length (length of consecutive 0-values) of 0 and the value (the value of non-zero) of 16, with the result that the data becomes 11111010. At first, it is assumed that the data preceding this data have been normally decoded, and therefore it is not necessary to consider these preceding data. According to the Huffman encoding table shown in FIG. 6, the data of 11111010 is broken down into 11, 11 and 1010. Since 11 has the run-length of 0 and the value of 1, it becomes different from the original data. Furthermore, since the data of 1010 does not exist in the Huffman encoding table, numerals from the next data of 101110111 are added in sequence to 1010, and then the decoding is performed. As a result, the first 10101 in 1010101110111 is decoded to the run-length of 0 and the value of 5 according to the Huffman encoding table of FIG. 6.

In 01110111 which remains as a result of removing 10101, 01110 is decoded to the run-length of 0 and the value of 7 according to FIG. 6. In the remaining 111, the first 11 is decoded to the run-length of 0 and the value of 1. The 1 which remains at the end does not exist in the Huffman encoding table, and the next data of 10110111 is put after the 1, and then the decoding operation is performed on the resulting 110110111. To begin with, the first 11 is decoded to the run-length of 0 and the value of 1, and then 01101 to the run-length of 5 and the value of 1. As a result of the above-described operation, the decoded data becomes as shown in FIG. 7, and fails to have information on an EOB.

In the decoding operation, generally, an EOB functions as a break point of one process. If there is no information of this kind, it is judged that the data of the succeeding block after an EOB are included in the data of the currently processed block, and the decoding operation is performed under this judgment. Namely, when the data (FIG. 7) decoded in the above-described decoding operation are rearranged into an 8×8 element block, they become as shown in FIG. 8, with the result that there is a great difference between them. Moreover, the blank portions shown in FIG. 8 are filled with the data of the succeeding block. Consequently, the decoding operation is erroneously performed also on the data of the succeeding block. This causes an error not to be limited to one block, resulting in an error which produces a large effect.

FIG. 9 shows the code configuration in an error correction system which has been used very frequently in recent years and which is called double Reed-Solomon. To the data of m bytes×n bits, at first, an error-correcting code of $C_n \times m$ bytes is added in the longitudinal direction, and then an error correcting code of $C_m \times (n+C_n)$ bytes is added in the transverse direction, so as to perform the double error correction. Thereafter, the encoded data are transmitted.

FIG. 10 shows an example of a specific transmission. The simplest transmission method is shown in FIG. 10 in which codes of $m+C_m$ bytes are transmitted in one unit and this is repeated $(n+C_n) \times 8$ times (1 byte consists of 8 bits). In this case, the error-correcting code of $C_m$ bytes is referred to as C1 parity, and the error-correcting code of $C_n$ row is referred to as C2 parity. Since a transmission is conducted in units of one bit in a general digital transmission system, synchronous data (hereinafter, referred to as SYNC) for performing the synchronization for the conversion into the units of bytes, and identify data indicative of the row number (the position in the longitudinal direction) in FIG. 9 and their parity data (hereinafter, these are referred to as ID data) are added to the $m+C_m$ bytes, and thereafter the transmission is conducted. In order to improve the pulling-in of a PLL in the decoding system, a synchronous area which is sometimes called a preamble may be placed before the entire $(n+C_n) \times 8$ cycles, and then the transmission is conducted.

Recently, for business or domestic use, a recorder of the helical scan type has been employed for recording a large amount of data (especially, video data) on a magnetic tape. FIG. 11 shows an example of its tape pattern. As shown in FIG. 11, track patterns which are oblique with respect to the tape running direction are formed. This method is a very effective one because it is relatively easy to improve the area recording density as compared with the method in which data are recorded in parallel with the tape running direction. As seen also from FIG. 11, however, it is difficult to achieve the continuity in time between the tracks in the microscopic sense. In a VTR or the like for domestic use, for example, the portions connecting tracks are assigned to record the video signal regions called the vertical blanking periods which are affected in a reduced degree even if damaged. Namely, in such a VTR, use of double error correction is usually selected so that the block size for the error correction code is included within one track and does not extend over a plurality of tracks.

A method called the variable-length encoding is known as one of the ways for efficiently transforming data having a high level of redundancy. This is de-scribed with reference to FIGS. 12(A) and 12(B), hereinafter referred to as FIG. 12. A to F shown in FIG. 12, which are called symbols, indicate the states of data to be compressed. In the event that this encoding is used in combination with the run-length encoding, the zero run-length functions as a symbol, and in case of a gray-scale video signal, the value itself functions as a symbol. When a video signal is subjected to the high-efficiency encoding, the combination of the orthogonal transform, the run-length encoding and the value itself may function as a symbol. Each symbol is assigned with a code in accordance with its generation frequency. FIG. 12 shows an example in which generation frequencies are gradually decreased along the sequence of A to F. While the code-length of A is 1 bit, the code-length of F is 5 bits. In this way, the higher the generation frequency of a symbol, the shorter the code-length which is allocated to the symbol. This causes the entire code-length to be shortened, thereby enabling the encoding to be efficiently performed. A process of variable-length encoding which is widely employed in general uses the Huffman codes. A block diagram of an encoder which adds error-correcting codes to thus encoded variable-length data is shown in FIG. 13.

The encoder shown in FIG. 13 has a code converter 111 which performs the variable-length encoding, a buffer memory 112 which stores the capacity of m×n bytes shown in FIG. 9, and an error-correction encoding unit 113 which adds error-correcting codes of C1 parity and C2 parity. This encoder operates as follows: a code conversion process is done using, for example, an encoding table such as shown in FIG. 12 in a ROM or the like; the code-converted data is stored in the buffer-memory 112 of the capacity in the unit of one error-correction encoding unit 113; the error-correcting codes are added to the output of the buffer memory 112 by the error-correcting encoder 113; and then the data is sent out to a transmission channel.

When a tape recorder of the helical scan type is employed as a transmission medium, the problems described below arise.

FIG. 14 shows a locus of a head trace of a tape recorder of the helical scan type in a trick play state such as the fast forward moving state. In FIG. 14, L and R indicate the directions of azimuth recording which has an object of eliminating crosstalk components between adjacent tracks. The L and R azimuths are symmetric with respect to an axis perpendicular to the longitudinal direction of the track. Tracks of the L azimuth cannot be reproduced by the R azimuth head, and tracks of the R azimuth cannot be reproduced by the L azimuth head. In FIG. 14, the locus of a head trace in a high speed reproduction in which the tape velocity is eight times that of the normal running is shown on the tape pattern. If the azimuth of this head is the L azimuth, tracks of the R azimuth cannot be reproduced, and therefore the reproduction output of the head is obtained only from the hatched portions in FIG. 14. This output is shown in 15. As shown in FIG. 15, in a high speed reproduction, a satisfactory output can be obtained only during a fixed period. Unless one or more C1 blocks are included within this period, it is impossible to perform the error correction in the C1 direction. Generally, one or more C1 blocks are included. In such a trick play mode, despite the sign of the double product, it is possible for the error correction to be performed only in one direction, and the decoding in a trick play mode also is generally performed in the unit of C1. In this case, assuming that, for example, data shown in FIG. 16 are recorded and that the reverse azimuth trace is conducted so that the portion before the dotted line cannot be decoded and the portion after the dotted line is decoded, when the decoding is performed on data after the dotted line using the encoding table of FIG. 12, there is a problem in that the original symbols F and A are decoded by being changed to the symbol D. When an image signal is encoded, for example, the video signal is subjected to the DCT transform onto the frequency region, as shown in FIG. 3, and then to the variable-length encoding by performing the run-length encoding as shown by the arrow. In such an encoding process, the problem of a changed symbol appears as data shifted to a different frequency region, so that the resulting image is entirely different from the original image. Furthermore, in the subband encoding which is frequently employed in a high-efficient encoding of an audio signal or the like, a signal such as shown in FIG. 17(A) is passed through a subband filter to be frequency-divided, whereby the signal is band-divided to be encoded as shown in FIG. 17(B), with the resulting problem of a changed decoding symbol appearing as data shifted to an entirely different band. The problems of the high-efficient encoding and error correction blocking involve a serious problem in a transmission system of a tape medium, particularly in a trick play mode, etc.

When video data which have been converted to digital signals are recorded on a recording medium such as a tape as they are, the data amount is enormous and generally exceeds the limitation of the data amount recordable on the recording medium. When a digital video signal is recorded on a tape or the like, therefore, the video signal must be compressed so that the data amount does not exceed the limitation of the tape. The compression of a video signal is conventionally conducted using a high-efficient encoder. A high-efficient encoding system which is generally studied today is the motion-compensation cosine transform coding system described in, for example, "STUDY ON FILTERS IN ENCODING LOOP IN MOTION-COMPENSATION COSINE TRANSFORM ENCODING" disclosed in IE86-100 (Technical Report of the Institute of Electronics, Information and Communication Engineers). A block diagram of an encoder which performs this system is shown FIG. 18. In FIG. 18, 124 designates a DCT circuit, 125 is an inverse DCT circuit, 126 is a frame memory, 128 is a motion-vector extractor, 122 is a subtracter, 127 is an adder, and 123 and 129 are switches.

Next, its operation will be described. Since a two-dimensional DCT of 8×8 pixels is usually employed, it is supposed that data which have been blocked into 8×8 pixel blocks are sequentially input into the DCT circuit 124. When the switch 123 is connected to the upper side, the input data are subjected to the DCT process as they are. On the other hand, through the inverse DCT circuit 125 having the reverse characteristics, a signal which is substantially the same as the input signal is obtained and then stored in the frame memory 126. In this case, however, the switch 129 is connected to the right side. In the next frame, the switch 123 is connected to the lower side and the switch 129 to the left side. Then, at first, the signal of the current frame and that of the previous frame are input into the motion-vector extractor 128, and the motion vectors of the portions in which the image moves are extracted. The signal of the previous frame is read out from the frame memory 126 and is shifted by the degree of this motion. This signal and the signal of the current frame are input into the subtracter 122 to be subjected to the subtraction, and supplied through the switch 123 to the DCT circuit 124 in which the DCT process is performed, and then scanned in a zig-zag manner as shown in FIG. 3, to be encoded. On the other hand, this signal and the signal of the previous frame which has obtained the reverse characteristics in the inverse DCT circuit 125 and which has been shifted by the degree of the motion are added in the adder 127 to become the same as the input signal, and stored in the frame memory 126. In this way, by performing the motion-compensation difference process in the direction along the frames, and the two-dimensional DCT in a frame, the signal is very effectively encoded.

An example of the amount of codes generated by performing such an encoding process is shown in FIG. 19. The axis of the abscissa of FIG. 19 indicates frame numbers, and the frames shown by broken lines are those wherein the switches 123 and 129 of FIG. 18 are connected to the upper side and to the right side, respectively (referred to as intraframes). The other frames are those wherein the switches 123 and 129 are connected in the reverse manner (referred to as interframes). As shown in FIG. 19, interframes and intraframes are greatly different from each other in code amount. In a record pattern used in a conventional helical scan type such as shown in FIG. 11, one track is generated in each field and the length of one track is fixed, and hence in a case wherein the code amount varies greatly for each frame, there arises a great inconvenience. That is, when the track length is allocated in accordance with the code amount of the intraframes, the track length in the interframes is in excess, and in the contrary case the track length in the intraframes is in short. In order to solve this problem, a method may be proposed in which the rate of the generation of intraframes is previously set, a fixed length is selected so as to consist of some tracks (tracks the number of which is equal to the frame number of a span of the generation of intraframes), and this fixed length is assigned to each track. In this method, however, when an editing operation is to be conducted on each frame, there is a case in which a portion of a track beginning from its mid-point must be rewritten. The realization of this requires mechanical parts and control circuits which are very precise and expensive. Even if these are realized, furthermore, it is a usual process that as shown in FIG. 20, estimations in opposite directions are conducted and then the encoding is performed. In an editing operation for inserting another dynamic image after F3 of FIG. 20, if this portion is replaced with F'3 and F'4 of FIG. 21, the estimations indicated by marks "X" in FIG. 21 cannot be employed. Although F1 and F2 are not necessarily edited, therefore, F1 and F2 must be decoded and F1, F2, F'3 and F'4 are newly arranged in this sequence to be encoded again. Hence, that method is not suitable for an editing operation in units of a frame.

Moreover, in a camera input or the like, there may be a case in which the S/N ratio of an input signal is very poor. When a signal of a poor S/N ratio is input, an erroneous detection or the like occurs in the motion-vector extractor 128, causing a problem wherein the code amount suddenly increases.

SUMMARY OF THE INVENTION

It is an object of the invention to provide an encoder in which, even if an error occurs in a variable-length encoded data, the propagation of the error can be restricted within a block.

It is another object of the invention to provide an encoder and decoder which can eliminate errors during a decoding operation in a system of intermittently transmitting data such as a trick play mode.

It is a further object of the invention to provide an encoder and decoder which facilitate the editing operation in units of a frame and which can prevent the code amount from increasing even when an input signal has a poor S/N ratio.

An encoder of the invention counts the data length of a variable-length code, and time-division-multiplexes the information of the data length with a variable-length encoded data to perform the encoding. Therefore, it is possible to retrieve the position of an EOB code. Further, the decoding of the EOB can be correctly performed and an error does not propagate beyond an EOB code. Finally, even if an error beyond the error correction capability occurs, the error does not propagate over blocks.

Another encoder of the invention counts the code amount in a variable-length encoding process, calculates the number of first ignoring bits in a C1 block and time-division-multiplexes the information to add an error-correcting code. Alternatively, it counts the code amount in a variable-length encoding process, calculates the number of the first ignoring bits in a C1 block and after adding an error-correcting code, time-division-multiplexes the information. Since information on the number of the ignoring bits is time-division-multiplexed, this information on the number of the ignoring bits is available in a decoding process.

A decoder of the invention is provided with a mode in which, on the basis of information on the number of the ignoring bits which is time-axis-multiplexed in an encoding process, the first couple bits of a data which are error-correcting decoded in the direction of C1, are not sent to a variable-length decoding unit, and the remaining are sent to the variable-length decoding unit. Since the variable-length decoding is performed with the first couple bits ignored, symbols can be prevented from being changed during the decoding process.

When performing the variable-length encoding so as to extend over C1 blocks, another encoder of the invention assigns a special data (dummy data) which does not exist in an encoding table, to all of the remainings of the C1 blocks, and inserts the data thereinto. Therefore, this data will not be decoded in a decoding system, and there is no symbol change during the decoding process.

In another encoder of the invention, when performing the variable-length encoding so as to extend over C1 blocks, variable-length encoded data extending over the blocks additionally again inserts variable-length codes, from the top of the next C1 block. When the encoding extends over the next C1 block, therefore, the top of the next C1 block is again the top of a new variable-length code. Hence, the symbol change does not happen in the decoding.

Another decoder of the invention abandons a data which is the last one of a C1 block and on which the variable-length decoding cannot be accomplished. Therefore, a data on which the variable-length decoding fails at the end of a C1 block during the decoding is not considered in the variable-length decoding of the next C1 block, thereby eliminating symbols changed in the decoding.

Another encoder of the invention inserts particular important information such as high-efficient, encoded data of one frame among several tens of frames, or data in which the compression ratio of each frame is raised, into a previously set position of a variable-length encoded data. Since, in a special reproduction mode such as a trick play mode, important data can be located at a given position of the object trace, only the important data can be entirely reproduced in the special reproduction mode.

Another encoder of the invention is provided with a mode in which only particular information, at a previously set position after error-correcting decoding, is decoded. Since only important data can be surely decoded even in a super high speed reproduction mode such as a trick play mode, a reproduced image of excellent quality can be obtained.

In another encoder of the invention, when succeeding data are disabled for use and partition data of a block cannot be variable-length decoded, "O" is inserted into other data of the block and then the inverse orthogonal transform is performed. Since, in a case that, although succeeding data fall into a disable state, the process fails to reach an EOB code, "O" is inserted into the remaining data of the block and then the decoding is performed, the decoding is performed without obtaining abnormal decoding results.

In another encoder of the invention, when succeeding data are disabled for use and partition data of a block cannot be variable-length decoded, the data of the block are abandoned. Since, in a case that, although the succeeding data fall into a disable state, the process fails to reach an EOB code, the data of the block are abandoned, the decoding is performed without obtaining abnormal decoding results.

Another encoder of the invention obtains the sum of and the difference between the odd and even fields of one frame, and then encodes a video image signal. Since the encoding is performed so as to close within one frame, it is possible to perform the encoding with a higher compression ratio as compared with a case of encoding simply one frame. Furthermore, it is easy to conduct the editing operation in the unit of one frame.

Another encoder of the invention detects the poorness of the S/N ratio of a video image signal and controls the quantization level of the difference between fields. When the S/N ratio of a video signal is poor, the encoding is performed with a rough quantizing bit number of the difference between fields in which the increase of the code amount is particularly remarkable, whereby the increase of the code amount caused by a noise is prevented from occurring.

Another encoder of the invention selects the case in which the code amount is smallest, from a case in which the sum of fields and the difference between fields are obtained and the blocking is performed, a case in which the blocking is performed within a field, and a case in which the blocking is performed within a frame, and then performs the encoding. Therefore, the encoding efficiency is always optimum.

An encoder/decoder of the invention quantizes either of the sum of fields and the difference between fields with a bit number smaller than that for the other of them by one bit, and judges its sign and parity in the decoding process and decodes to respective field data. Therefore, even if either of them is reduced by one bit, it is possible to perform the decoding with high-fidelity.

Another encoder of the invention obtains the sum of fields and the difference between fields after the band division, and performs the encoding in which the more rough quantization is done on the higher frequency components of the difference between fields. Therefore, the compression ratio is improved without detecting the deterioration in the visual sensation.

These and other objects of the present application will become more readily apparent from the detailed description given hereinafter. However, it should be understood that the preferred embodiments of the invention are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 1(A) and 1(B) are block diagrams showing the configuration of a conventional encoder and decoder;

FIG. 2 is a diagram showing blocks of the DCT;

FIG. 4 is a diagram showing a specific example of DCT coefficients;

FIG. 5 is a diagram showing data which are obtained by performing the run-length encoding on FIG. 4 and the Huffman encoding using the Huffman encoding table of FIG. 6;

FIG. 6 is a diagram showing a portion (an example) of a Huffman encoding table;

FIG. 7 is a diagram showing decoded data obtained when a 1-bit error occurs in the data of FIG. 4;

FIG. 8 is a diagram showing data obtained by decoding the data of FIG. 7 to DCT coefficients;

FIGS. 39(A) and 39(B) are diagrams illustrating another improvement in the eighth embodiment;

FIG. 47 is a diagram showing an example of data for illustrating an effect of the eleventh embodiment;

FIG. 48 is a diagram showing an example of data for illustrating an effect of the eleventh embodiment;

FIG. 52 is a view showing the calculation method in the fourteenth embodiment.

DESCRIPTION OF THE PREFERRED EMBODIMENTS

First Embodiment

Figure 22A:
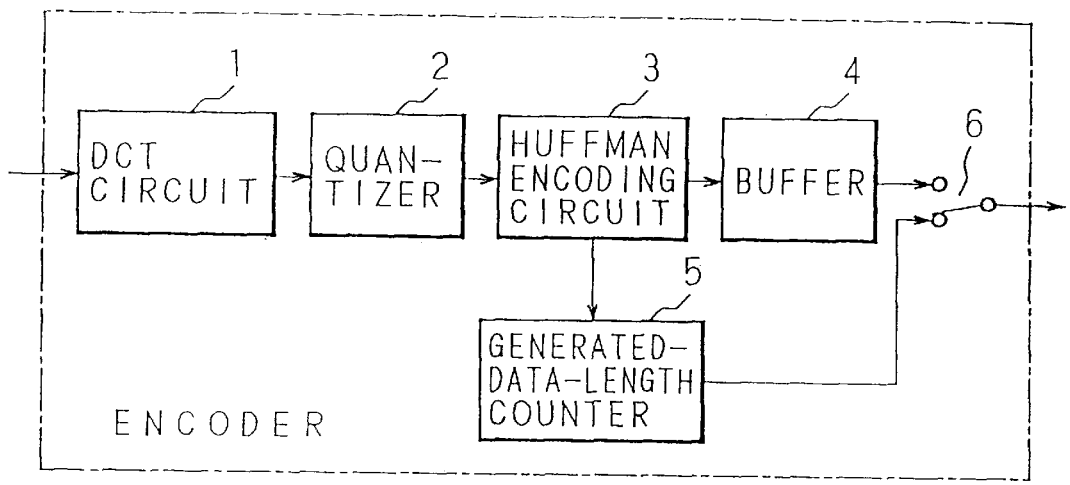
FIGS. 22(A) and 22(B) are block diagrams showing the configuration of an encoder and decoder according to a first embodiment of the invention.
Figure 22B:
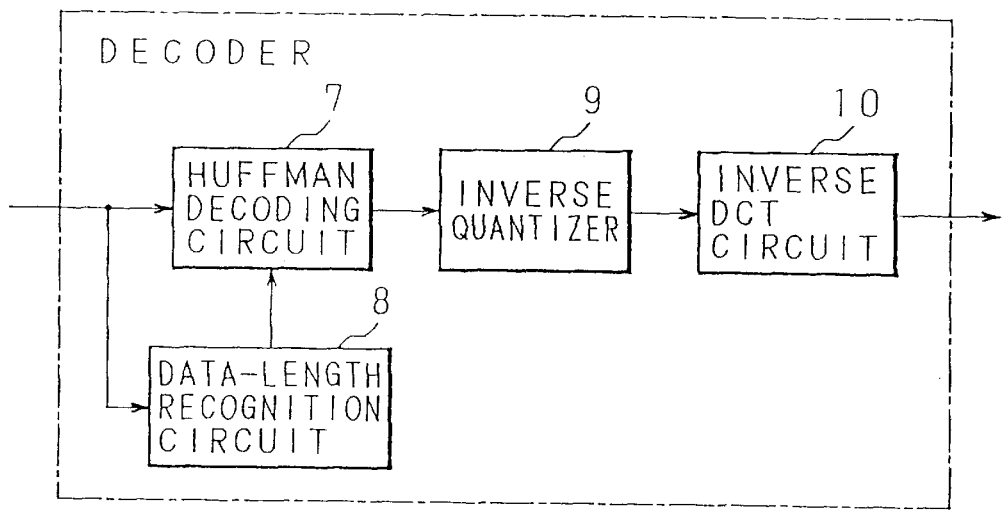

FIG. 22 is a block diagram showing the configuration of a first embodiment of the invention. An encoder shown in FIG. 22(A) has a DCT circuit 1 which performs the DCT on a blocked video signal, a quantizer 2 which quantizes the output of the DCT circuit 1, a Huffman encoding circuit 3 which performs the Huffman encoding on the output of the quantizer 2 in accordance with the Huffman encoding table, a buffer 4 which temporarily stores the output from the Huffman encoding circuit 3, a generated-data-length counter 5 which counts the length of generated data on the basis of the output from the Huffman encoding circuit 3, and a switch 6 which switches the output from the buffer 4 and that from the generated-data-length counter 5. A decoder shown in FIG. 22(B) has a Huffman decoding circuit 7 which decodes input data in accordance with the Huffman encoding table, a data-length recognition circuit 8 which recognizes the data length from input data, an inverse quantizer 9 which performs the inverse quantization on the output of the Huffman decoding circuit 7, and an inverse DCT circuit 10 which performs the inverse DCT on the output of the inverse quantizer 9.

Figure 3:
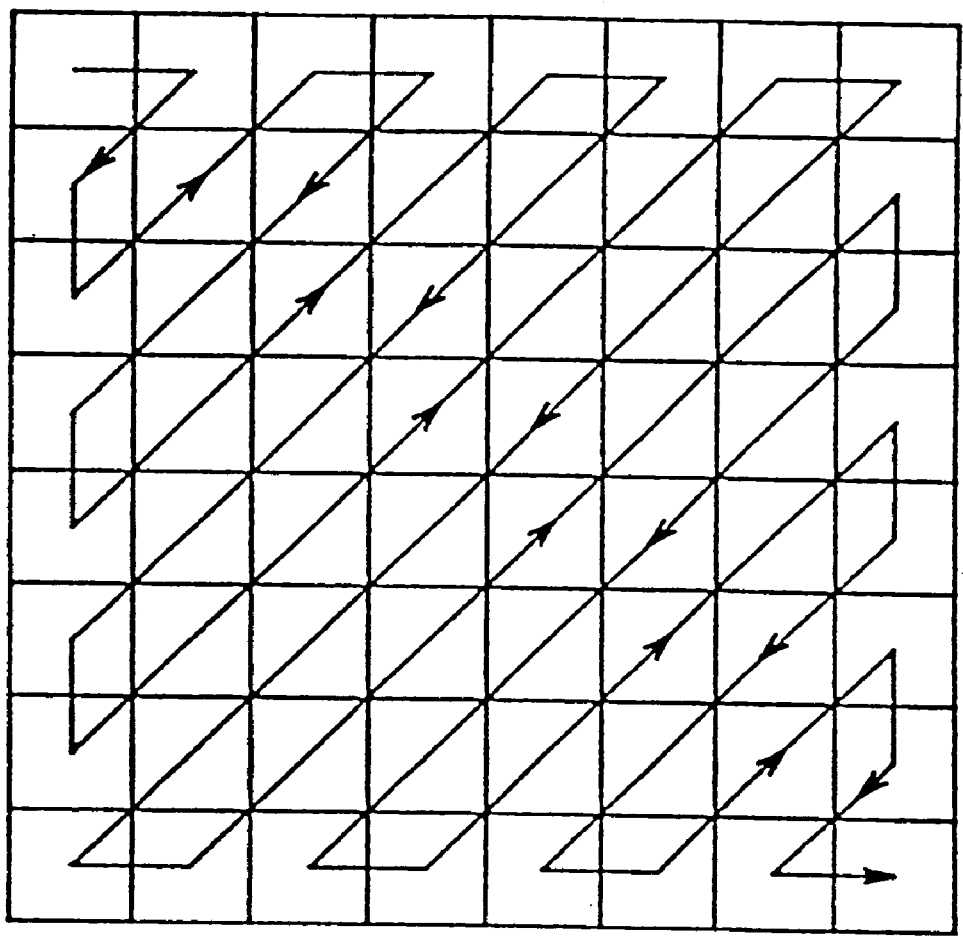
FIG. 3 is a diagram showing a sequence of a zig-zag scan for performing the run-length encoding in the variable-length encoding.
Figure 9:
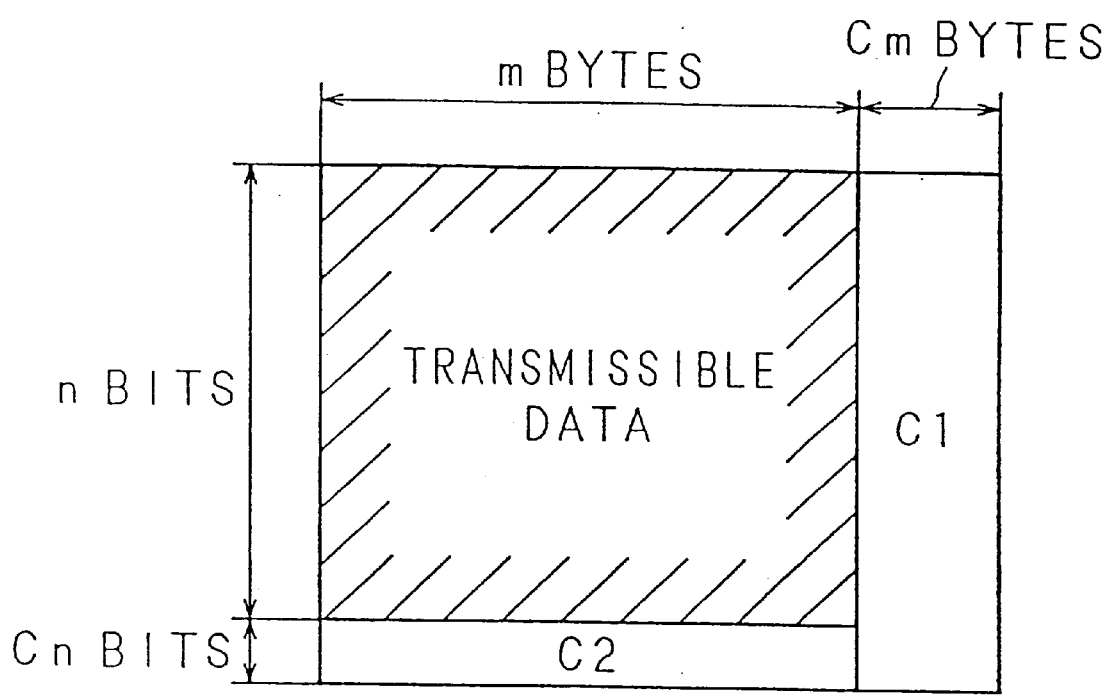
FIG. 9 is a structural diagram of double Reed-Solomon codes.
Figure 10:
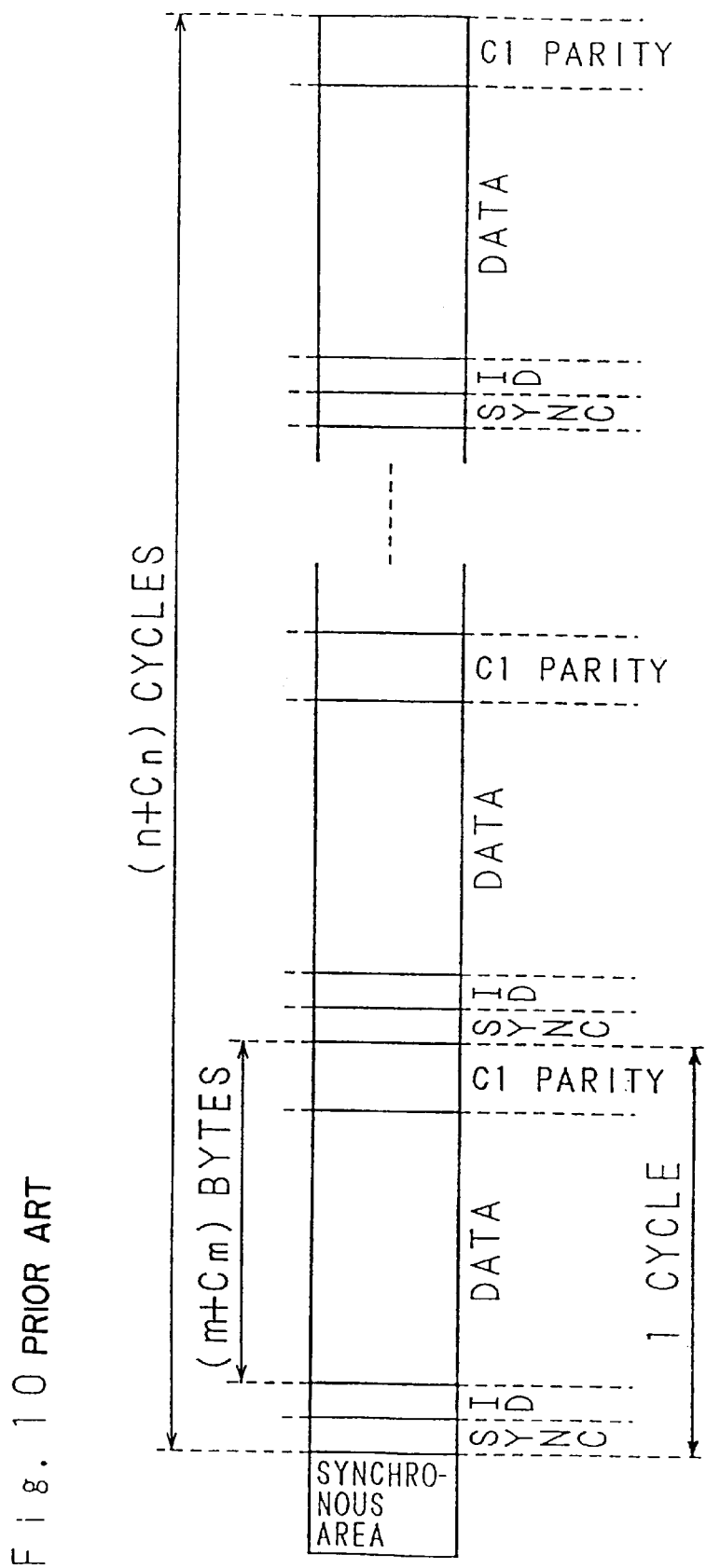
FIG. 10 is a diagram showing an example of a conventional code configuration to be transmitted.
Figure 11:
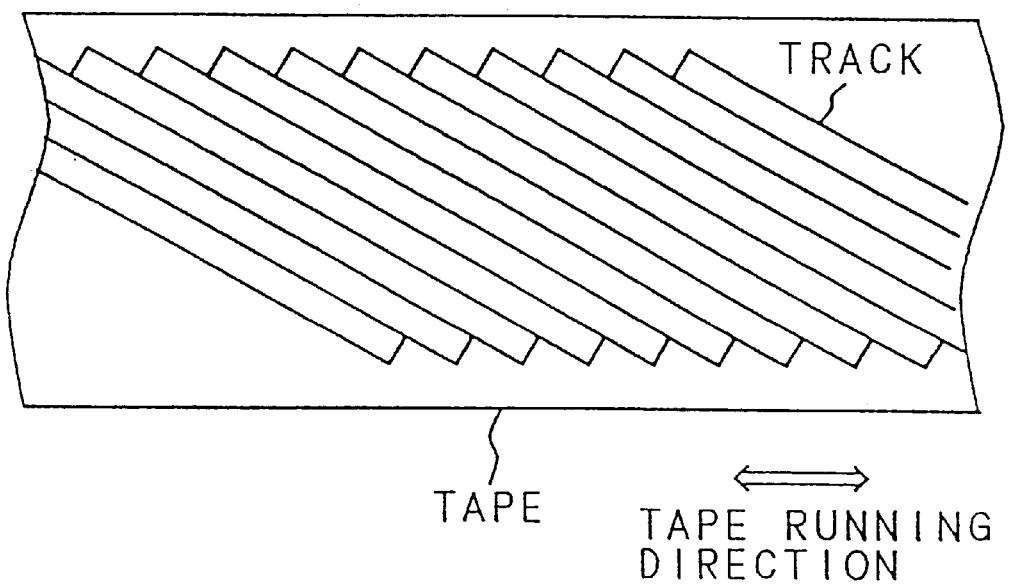
FIG. 11 is a diagram showing a tape pattern used in a tape recorder of the helical scan type.

Next, the operation of the encoder will be described. A video signal is blocked into (8 pixels in horizontal direction)×(8 pixels in vertical direction), for example, and input into the DCT circuit 1. The output of the DCT circuit 1 is input into the quantizer 2 to be quantized. This quantizer 2 may adequately perform the quantization in accordance with state of the image. Then, the quantized data are input into the Huffman encoding circuit 3 in which the data are at first scanned in a zig-zag manner as shown in FIG. 3 to be run-length encoded. The two-dimensional data of the run-length and the value are subjected to the encoding in which the code length is not fixed in accordance with the Huffman encoding table such as shown in FIG. 6, and then output from the Huffman encoding circuit 3.

On the other hand, the generated-data-length counter 5 counts the amounts of the data lengths generated in one block of 8×8 pixels. This can be readily realized by, for example, a configuration in which the data lengths of FIG. 6 are made into a table using a ROM or the like, the Huffman encoding and the output operation of the generated length of the data are simultaneously performed, and it is accumulated to be added. The buffer 4 merely functions to store data. To the switch 6 are supplied a Huffman-encoded data and information indicative of its generated data length.

When, at the first of the block, the switch 6 selects information indicative of the generated data length and then a variable-length encoded data, for example, the receiving side (the side of the decoder) can know at first the data length of the block among the time-division-multiplexed data. Therefore, even when an error occurs in variable-length encoded data and an EOB code is lost, since it is sure that the EOB code exists at the last portion of the data length, it is possible to deduce the position of the EOB code from the information indicative of its data length. Namely, in such an encoder, an EOB will never be lost.

Figure 23:
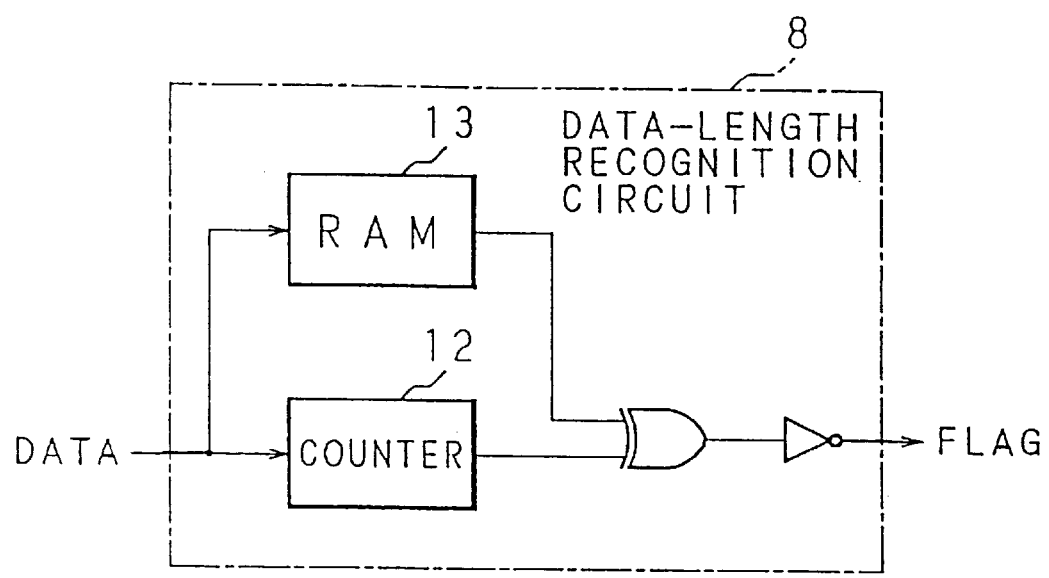
FIG. 23 is a block diagram of a data-length recognition circuit in FIG. 22.

Next, the operation of the decoder shown in FIG. 22(B) will be described. The data-length recognition circuit 8 is a circuit which recognizes the above-mentioned information indicative of the data length and search the position of the EOB code, and a circuit which monitors so that the Huffman decoding circuit 7 does not lose an EOB code. Specifically, it is configured as shown in FIG. 23. The data-length recognition circuit 8 has a counter 12 which counts the length of an input data, and a RAM 13 which stores incoming information of the aforesaid input data length. When the length of an input data agrees with the aforesaid information indicative of the input data length, it sets a flag which interrupts the Huffman decoding even if it has not yet been ended. According to this flag, the Huffman decoding circuit 7 can interrupt the Huffman decoding process.

Figure 24:
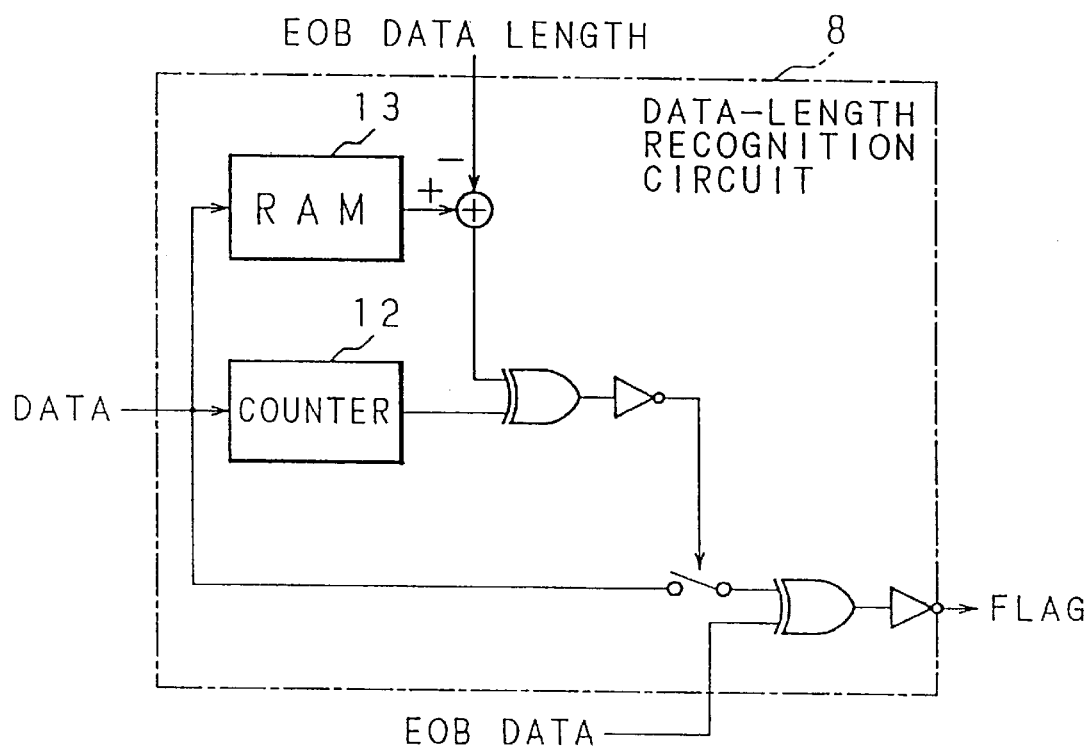
FIG. 24 is a block diagram of another data-length recognition circuit in FIG. 22.

In order to reduce the error propagation to a smaller degree, a process may be performed in which the decoding reversely proceeds from an EOB code. Since information of the data length is very much shorter than a variable-length data, there is little possibility that an error occurs in the information of the data length. Furthermore, the data-length recognition circuit 8 configured as shown in FIG. 24 can conduct a double check using the actual data of an EOB code.

Figure 25:
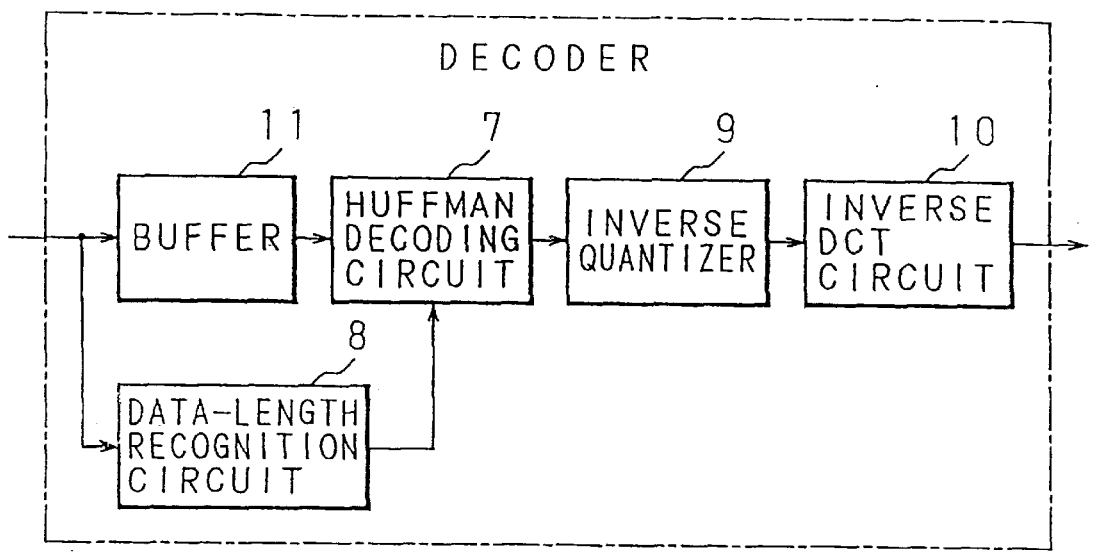
FIG. 25 is a block diagram showing the configuration of an encoder which is a modification of the first embodiment.

Information indicative of a data length may be transmitted in a fixed length or in a variable length. When the position of an EOB code is approximately determined, the data-length recognition circuit 8 can search the position of the EOB code. Therefore, needless to say, the information indicative of its data length may be rough information (e.g., the least significant bit is omitted). When rough information only is transmitted, however, the search for an EOB code requires a considerable period of time. In such a case, hence, it must be configured so that incoming data are once stored in a buffer 11 as shown in FIG. 25.

Although, in the above embodiment, as the block transform encoding the DCT has been specifically described, and as the variable-length encoding the Huffman encoding has been described, any block transform encoding and variable-length encoding other than these may be used. Moreover, although the above-described embodiment employs the variable-length encoding in which an EOB code is transmitted, according to this embodiment, information of the data length is transmitted. Thus, it becomes unnecessary to transmit an EOB. Therefore, there is a further effect that the transmission of an EOB can be omitted. Although the embodiment of FIG. 22 uses the switch 6 in order to divide in time and serially multiplex information of a generated data length and a variable-length encoded data, needless to say, information of a data length may be written at a certain fixed address of a buffer 4 and serially read out.

(Second Embodiment)

Figure 26:
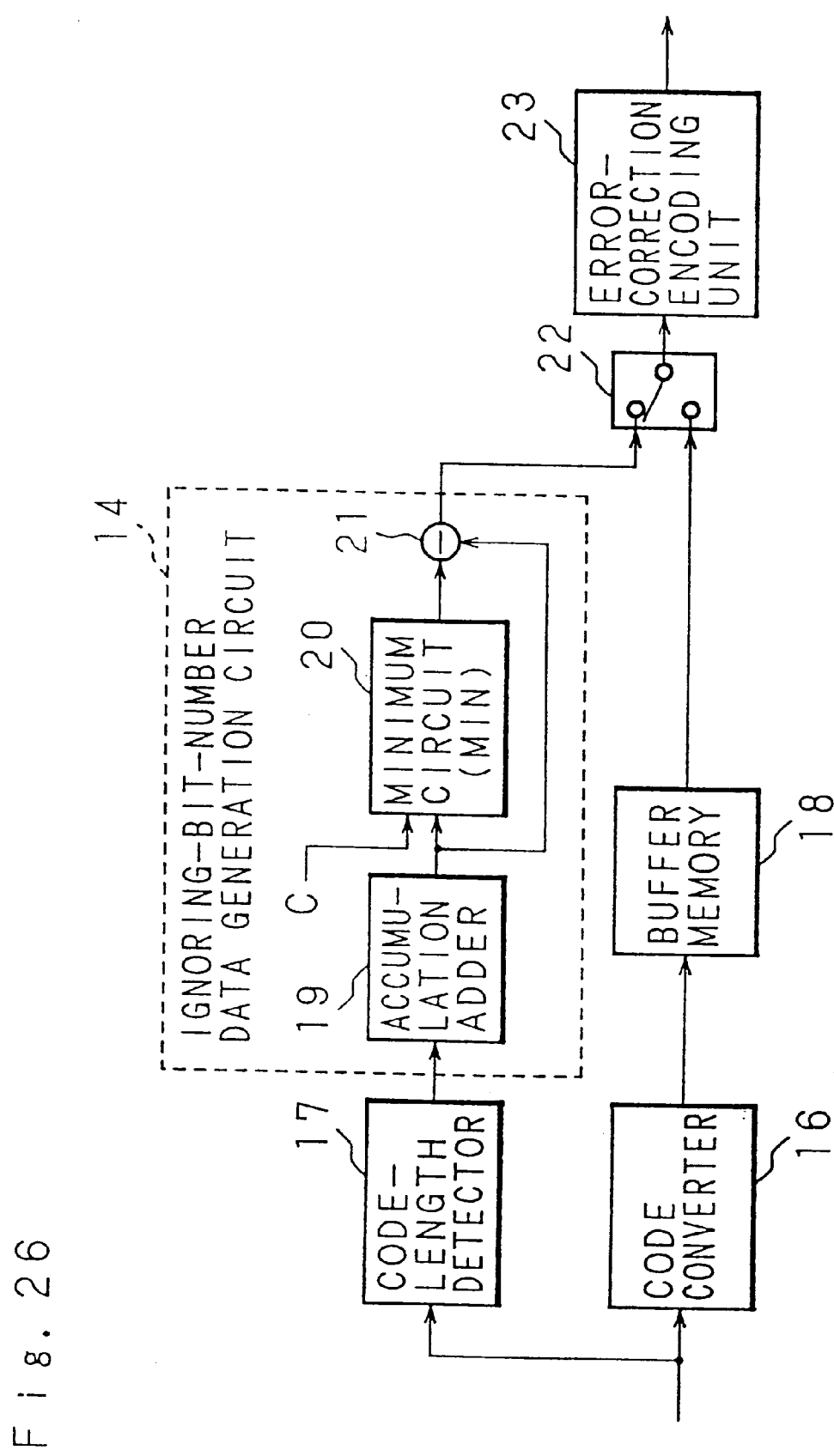
FIG. 26 is a block diagram showing the configuration of an encoder according to a second embodiment.

FIG. 26 is a block diagram showing the configuration of an encoder in a second embodiment. In FIG. 26, the encoder is composed of a code converter 16 which performs the code conversion in accordance with a predetermined encoding table, a code-length detector 17 which detects the code length of a generated variable-length encoded data, a buffer memory 18 which stores the output of the code converter 16, an ignoring-bit-number data generation circuit 14 which generates the ignoring-bit-number data on the basis of the output of the code-length detector 17, a switch 22 which switches the output of the buffer memory 18 and that of the ignoring-bit-number data generation circuit 14, and an error-correction encoding unit 23 which adds an error-correcting code to the output of the switch 22. The ignoring-bit-number data generation circuit 14 consists of an accumulation adder 19 which accumulates the output from the code-length detector 17, a minimum circuit (hereinafter, referred to as "MIN") 20 which outputs the smaller one of the output of the accumulation adder 19 and a constant C which is input from the outside, and a subtracter 21 which subtracts the output of the MIN 20 from that of the accumulation adder 19.

Then, the operation will be described. Input data are variable-length encoded by the code converter 16 performing the code conversion in accordance with an encoding table which is so designed that the code length becomes shorter with the higher generation frequency in a similar manner as the Huffman code, and then stored in the buffer memory 18. At the same time, the code-length detector 17 detects the code lengths of the generated variable-length encoding, and the code lengths are accumulated to be added by the accumulation adder 19 and then passed to the MIN 20. As the constant C input into the MIN 20, is a given value obtained, for example, by subtracting from m bytes which is the addition unit of C1 parity (i.e., m×8 bits) the bit number of the data generated by the ignoring-bit-number data generation circuit 14 (since it is usual that the code length for one symbol of the variable-length encoding is less than bits, about 5 bits are usually sufficient for the generation of the ignoring-bit-number data).

$$C = m \times 8 - 5$$

Figure 27:
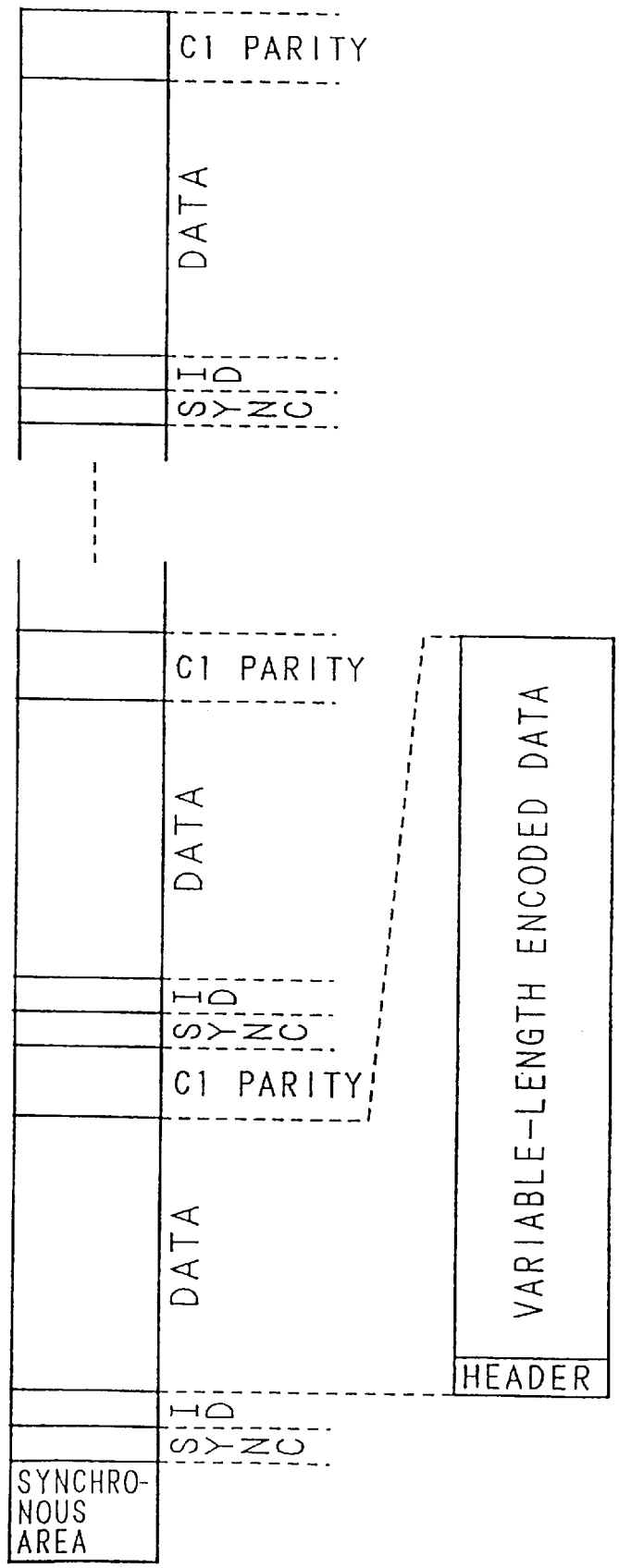
FIG. 27 is a diagram showing a code configuration in the encoding performed by the encoder of FIG. 26.

When the value of the accumulation adder 19A is greater than this value of C, the output of the MIN 20 selects C. Then, the output of the subtracter 21 is A−C, and namely it becomes equal to the data bit number which overflows into the next C1 block. This value is selected by the switch 22 during the first 5 bits of the next C1 block to be time-division-multiplexed, whereby the data list shown in FIG. 27 is obtained. In this case, during when the switch 22 selects the ignoring-bit-number data, the read out of the buffer memory 18 is controlled so as not to be conducted. When the process is transferred to the next C1 block, the accumulation adder 19 performs the initial operation. Its initial value may be the value of A−A=0.

Therefore, it is entirely unnecessary to restrict the circuit for generating the ignoring-bit data to FIG. 26. Needless to say, the calculation in which the accumulation-adding result is divided by C to obtain the remainder may be used. Furthermore, as the ignoring-bit-number data, the bit number of a code located in the previous C1 block may be obtained.

Moreover, the above is also applicable to the provision of the buffer memory 18 and the presence of the switch 22. If the above-mentioned operation only is to be done, the minimum of operation can be done with the buffer memory 18 of m bytes. The data accumulation function for adding an error-correcting code to data of m×n bytes may be provided to the error-correction encoding unit 23. For example, a similar function can be realized by providing the buffer memory 18 with a the output of the subtracter 21. Alternatively, this may be similarly realized by further providing a memory for storing the ignoring-bit-number data which is the output of the subtractor 21 and by controlling the read out of the buffer memory 18. In a case of adopting such a configuration, it is convenient for the buffer memory 18 to have a capacity of m×n bytes.

Figure 28:
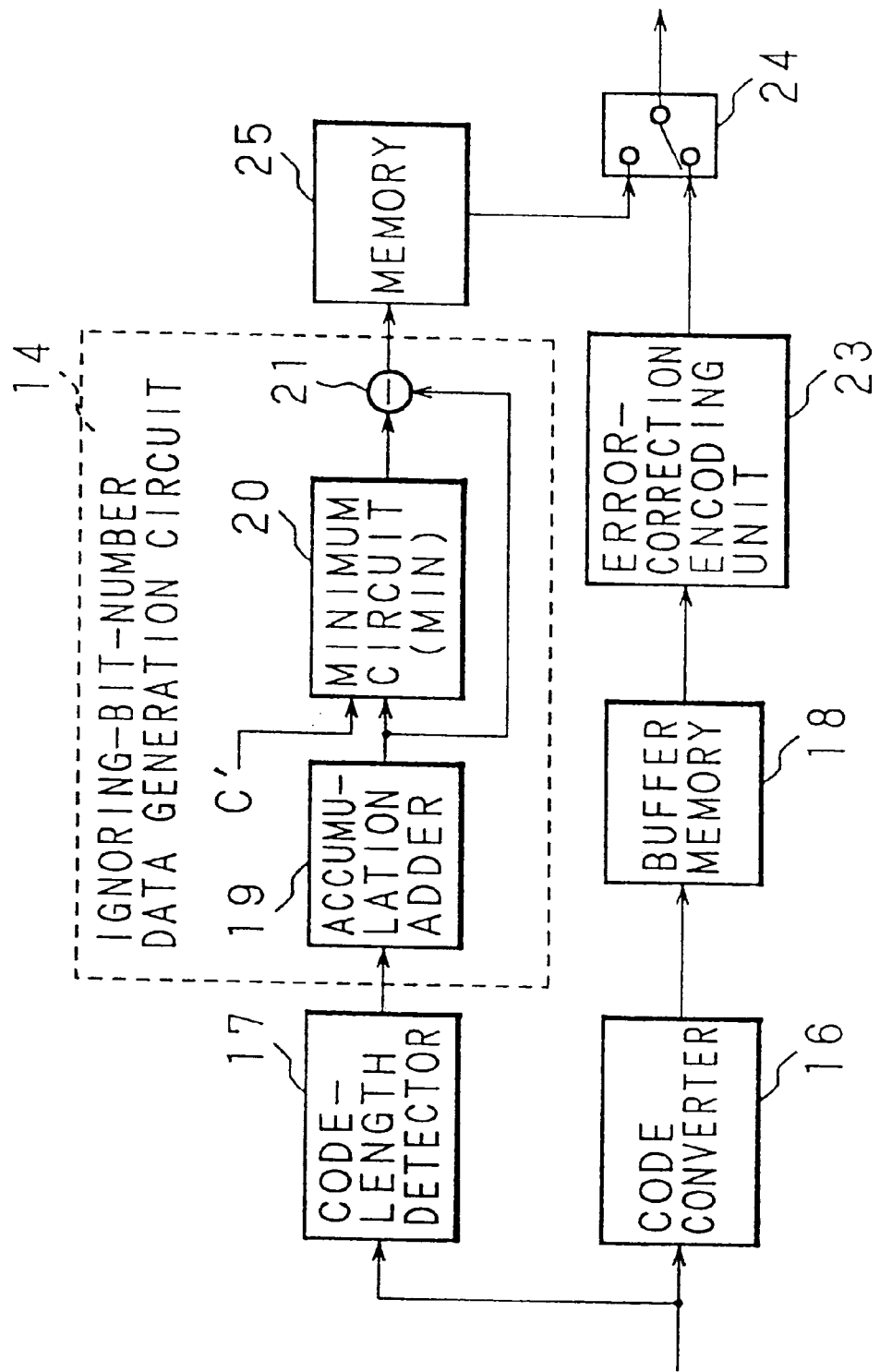
FIG. 28 is a block diagram showing another configuration of the encoder according to the second embodiment.
Figure 29:
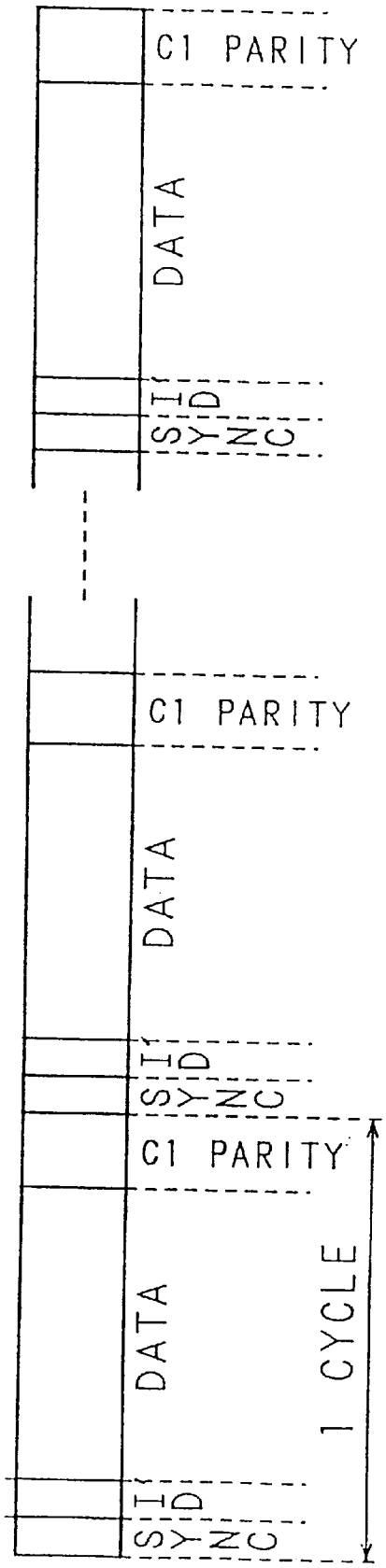
FIG. 29 is a diagram showing a code configuration in the encoding performed by the encoder of FIG. 28.

Furthermore, it is not necessary to have such ignoring-bit-number data in the form of a data in the m bytes, but it may be possible to have such a data in the ID data area in FIG. 29. The configuration of an encoder for time-axis multiplexing an ignoring-bit-number data in this way in addition to m-byte data is shown in FIG. 28 in which 24 indicates a switch and 25 indicates a memory.

Next, the operation will be described. Since the operation is fundamentally the same as that of FIG. 26, only the different portions will be described. The value of the one input of the MIN 20 is (m×8−5) in FIG. 26, but m×8 in FIG. 28. Because an ignoring-bit-number data is possessed in addition to the m bytes, the whole of the data of the m bytes can be used. In FIG. 28, accordingly, C'=m×8 is satisfied. Moreover, since the output of the subtracted 21 is added with an error-correcting code and then time-division-multiplexed, the requirement for once storing it into a memory is increased. The memory 25 is a memory for this purpose, and configured so that the switch 24 can switch data stored in the memory 25 and the output of the error-correction encoding unit 23. However, when the switch 24 is connected to one of them, the other of them must stop its output (read out) operation. Data output from the circuit which functions in this manner have a structure shown in 29.

Further, needless to say, the memory 25 may additionally store the original ID data and SYNC data. If this is not the case, there exists at any other place a block in which the ID data and SYNC data are added. Moreover, in FIG. 28, an ignoring-bit-number data is multiplexed to the ID data. Alternatively, a method may be employed in which it is multiplexed into C1 parity using a technique such as superposed codes disclosed in "New Classes of Binary Codes Constructed on the Basis of Concatenated Codes and Product Codes," IEEE Transactions on Information Theory, No. 4, 1976, pages 462–468. Furthermore, needless to say, the aforesaid variable-length encoding may be variable-length codes having a mode of escaping to a fixed length.

(Third Embodiment)

Figure 30:
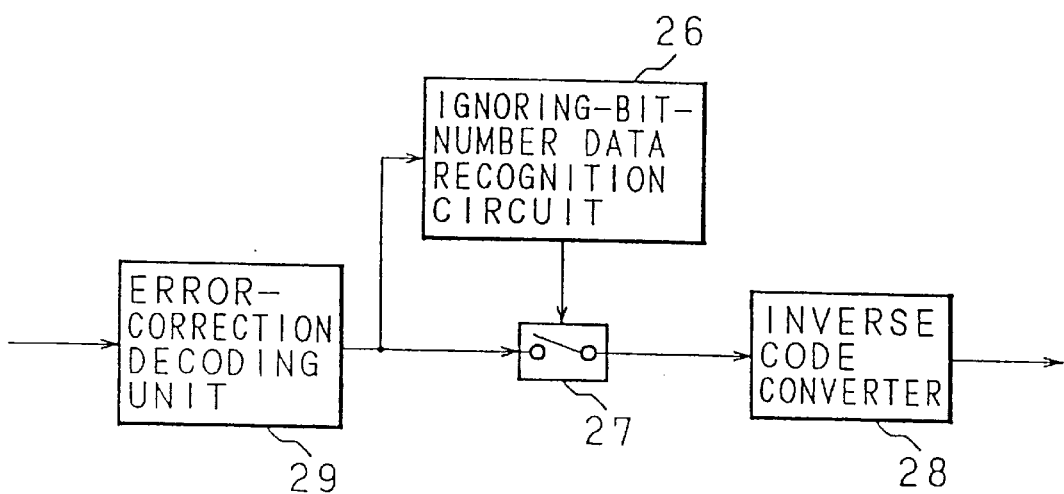
FIG. 30 is a block diagram showing the configuration of a decoder according to a third embodiment.

FIG. 30 is a block diagram showing the configuration of a decoder of a third embodiment used in the decoding of encoded data which have been encoded, for example, by the encoder of FIG. 26 and passed through a transmission medium such as a tape. In a transmission system such as a tape medium, there may exist a product for reproduction only, and therefore there may exist also a product using a decoder. The decoder shown in FIG. 30 has an error-correction decoding unit 29 which performs the error-correcting decoding an ignoring-bit-number data recognition circuit 26 which fetches an ignoring-bit-number data at a fixed position from data of m bytes, a switch 27 of the ON/OFF operation which is controlled by a control signal from the ignoring-bit-number data recognition circuit 26, and an inverse code converter 28 which performs the inverse code conversion on the output of the switch 27.

Figure 16:
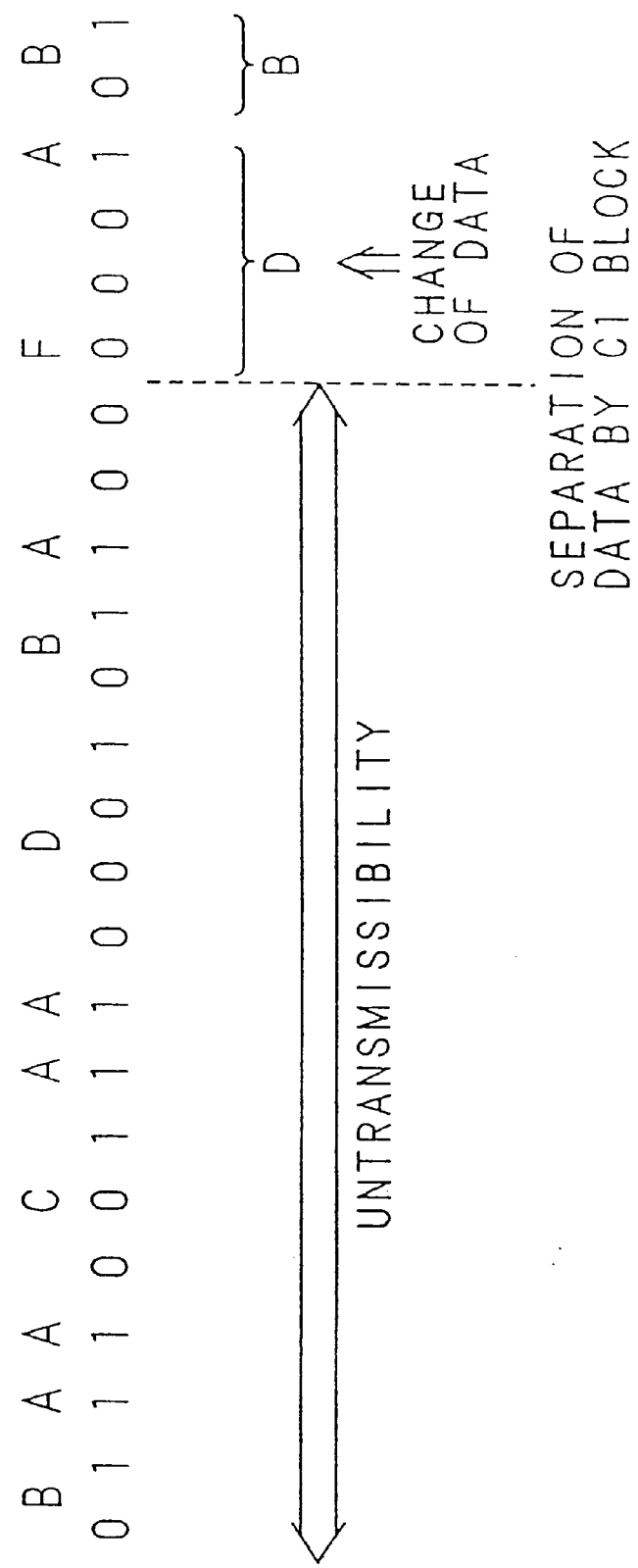
FIG. 16 is a diagram indicating a problem of a conventional encoder.
Figure 17A:
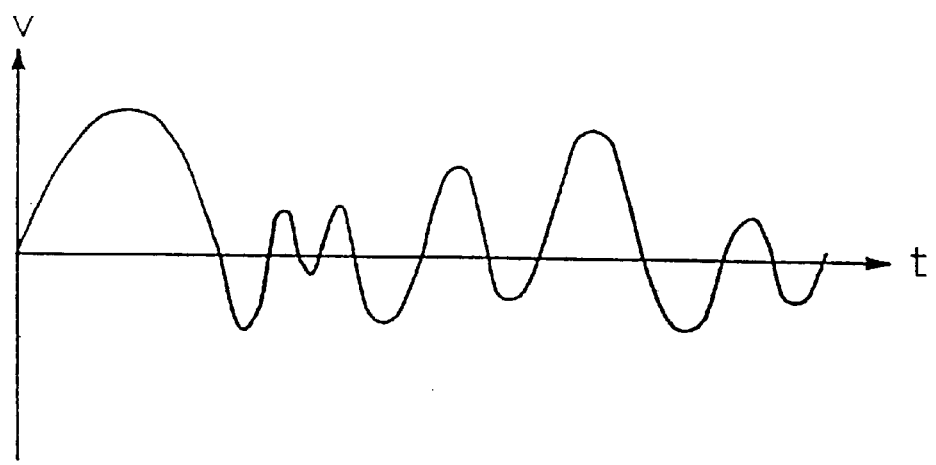
FIGS. 17(A) and 17(B) are diagrams showing the subband encoding of audio data.
Figure 17B:
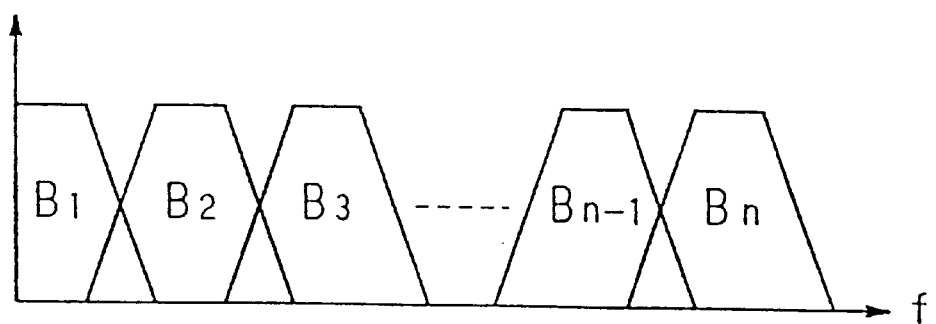
Figure 18:
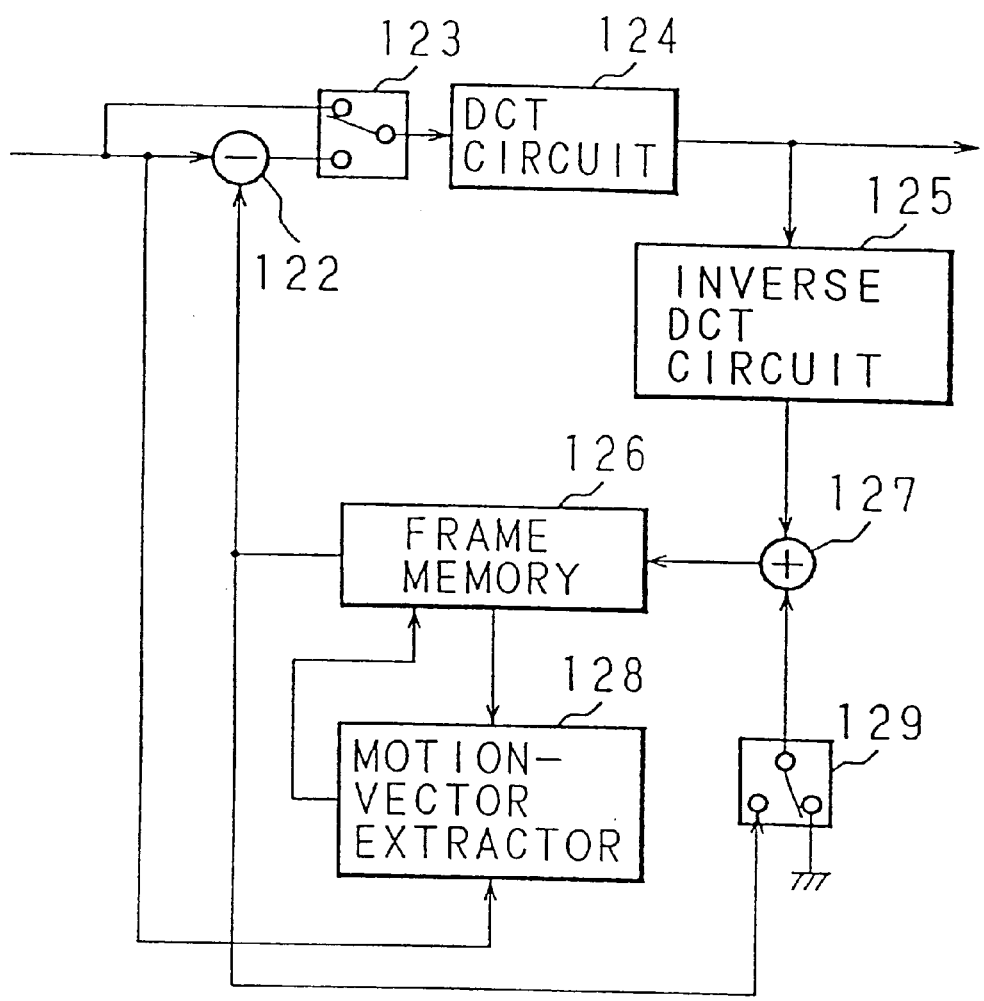
FIG. 18 is a block diagram showing the configuration of a conventional encoder.

Next, the operation will be described. A signal (a reproduction output in the case of a tape recorder) which has passed through a transmission medium is subjected to the error correction in the error-correction decoding unit 29 to correct an error caused by a poor S/N ratio of a transmission channel, and is then output as error corrected data. In a case that a special high speed reproduction or the like is done in a tape recorder, etc., it is preferable to decode in the unit of C1 block. However, after the error correction decoding is done in the unit of C1 block, a control signal for controlling the bit number of data to be ignored in the variable-length decoding is sent from the ignoring-bit-number data recognition circuit 26 to the switch 27, thereby controlling the input of the inverse code converter 28. The ignoring-bit-number data are 5 bits in the description of the second embodiment. When the ignoring-bit-number is k bits, therefore, the switch 27 is turned OFF so that data of k+bits are not subjected to the inverse code conversion. Furthermore, the inverse code converter 28 begins the variable-length decoding operation after the switch 27 is turned ON. When the inverse code converter 28 can perform the decoding-inhibiting mask operation, it is sufficient for a flag of bits on which the mask operation is done to be set for k+5 bits. In this case, even if the switch 27 is not provided, the decoder is prevented from erroneously operating. According to this configuration, for example, 3 bits after the dotted line in FIG. 16 are not variable-length decoded, and the fourth and succeeding bits are correctly decoded. Thus, the problem of changed symbols is prevented from occurring.

Moreover, in a case that the configuration shown in FIG. 28 is adopted as the encoder, the input of the ignoring-bit-number data recognition circuit 26 may be a signal taken from a position before the error-correction decoding unit 29.

In the second and third embodiments, the case of performing only the variable-length encoding has been described. Alternatively, the encoding may be a combination of the fixed-length encoding and the variable-length encoding, or use a plurality of variable-length encoding techniques. Although double Reed-Solomon codes have been described as the error-correcting codes, any error-correcting code for fixed-length data the length of which is not variable in the unit of block may be used. For example, it is needless to say that encodings such as BCH codes, cross interleave codes, and the TORELIS encoding in which the code length is variable in some degree may be used. Although in the embodiment one ignoring-bit-number data is added to each C1 block, when the error-correcting block is small in size, one ignoring-bit-number data may be added to each m×n bytes. In a case that a plurality of variable-length encoding techniques (including fixed-length encoding techniques) are used, they may be so configured that the encoder performs the encoding with adding ignoring-bit-number data and information indicative of the techniques, the decoder recognizes the information, and a decode unit which performs the variable-length decoding (including the fixed-length decoding) decodes it. According to its simplest example, in a certain case (for example, a case wherein the frequency of occurrence is not biased in a statistical sense) a fixed-length encode unit is used, and in another case the encoding is performed using a variable-length encode unit or some variable-length encoding tables. If there is further header information, the multiplex may be done using the information.

(Fourth Embodiment)

Figure 31:
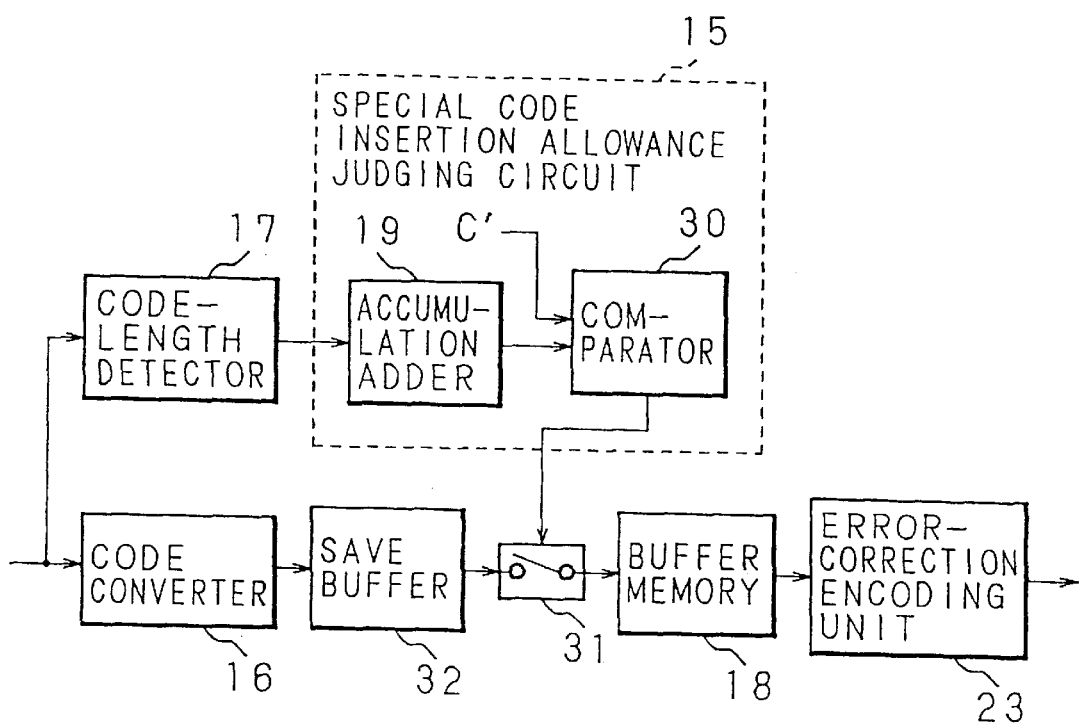
FIG. 31 is a block diagram showing the configuration of an encoder according to a fourth embodiment.

FIG. 31 is a block diagram showing the configuration of an encoder according to a fourth embodiment. The portions of FIG. 31 which are designated by the same numerals as FIG. 26 showing the second embodiment indicate the identical portions. In FIG. 31, 15 designates a special code insertion allowance judging circuit which consists of an accumulation adder 19 and a comparator 30 comparing the output of the accumulation adder 19 with a constant C' input from the outside, 32 a save buffer which temporarily stores the output from the code converter 16, and 31 a switch, the ON/OFF operation of which is controlled by a control signal from the special code insertion allowance judging circuit 15 (comparator 30).

Figure 32:
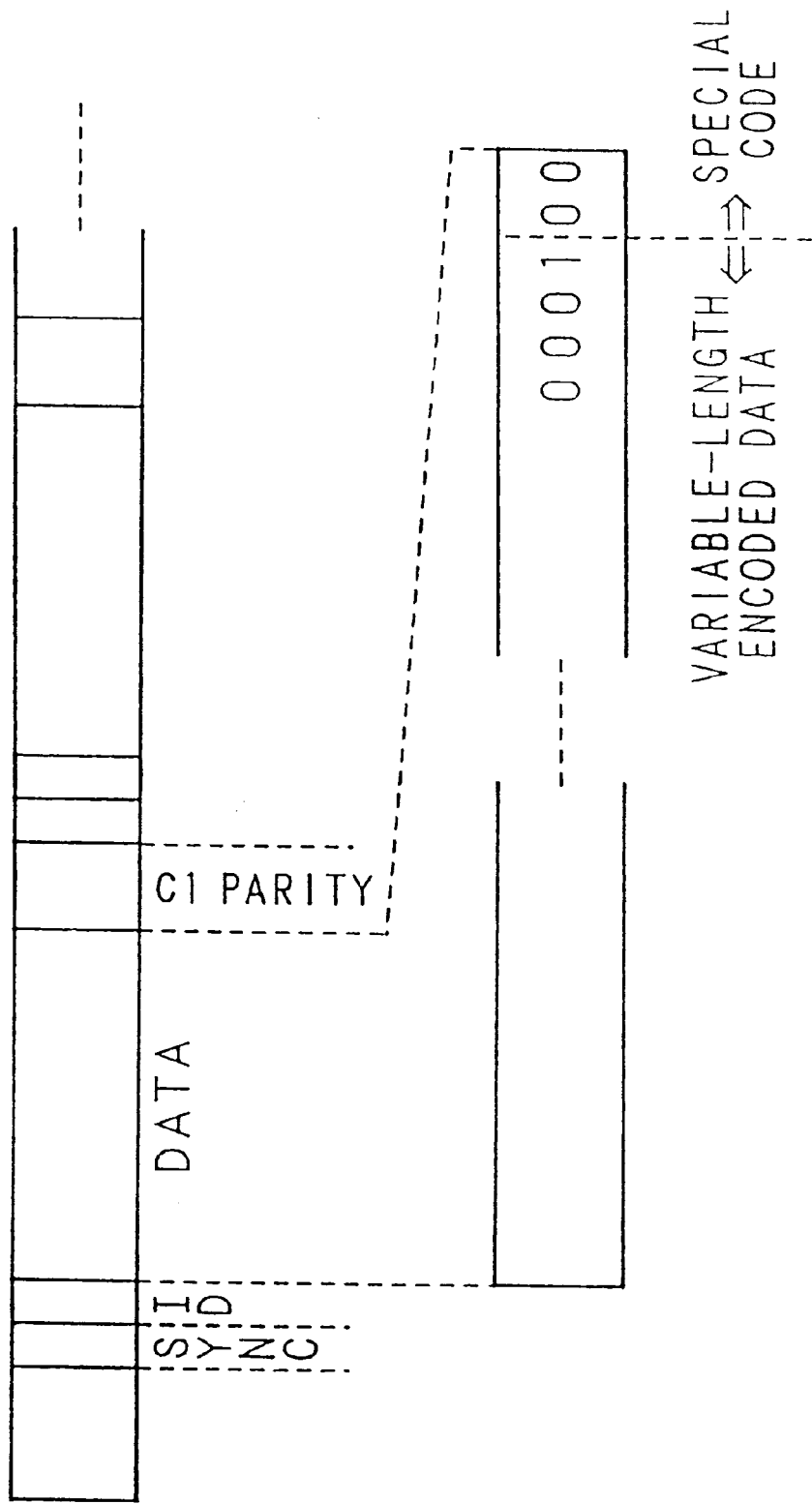
FIG. 32 is a diagram showing a code configuration in the encoding performed by the encoder of FIG. 31.

Next, the operation will be described. Input data are variable-length encoded by the code converter 16 and temporarily stored in the save buffer 32. On the other hand, the code-length detector 17 detects the code length of the generated conversion codes, the accumulation adder 19 accumulates and adds the generated code lengths and counts the total generated code length, and the comparator 30 compares the output of the accumulation adder 19 with the constant C' and judges whether or not the output of the accumulation adder 19 exceeds the constant C'. If the output of the accumulation adder 19 exceeds the constant C', the control signal is sent to the switch 31, thereby turning OFF the switch 31 so that one symbol of the variable-length code which causes this overflow is not sent to the buffer memory 18. At the same time, after the symbol immediately before the one symbol of the variable-length code which causes the overflow is read out, the read operation of the save buffer 32 is stopped. The buffer memory 18 has a capacity which allows write of data of m×n bytes, and is initialized to the data of all 0s each time when the operation of sending data of m×n bytes to the error-correction encoding unit 23 has been completed. The buffer memory 18 generally consists of a DRAM, etc., and has two memories of m×n bytes, and is so configured that the memory for reading and that for writing are selectively switched. In this switching, therefore, it is preferable that the memory is assigned to the writing side after the memory switch operation is initialized to the data of all 0s before the writing of data. These operations are equivalent to that of a state wherein a variable-length encoded data extending over an m-byte boundary is detected, the variable-length code for one symbol which causes this state is moved to the next m bytes, and 0s are inserted into the blank portion. Namely, data output from the encoder has a pattern shown in FIG. 32. In FIG. 32, when a symbol after the variable-length encoded data of 0001 has been code-converted takes 3 bits or more, 2 bits of 0, i.e., 00 are inserted. Of course, a variable-length code corresponding to the symbol which takes 3 bits or more is read out from the save buffer 32 during the generation of the next m-byte data, and positioned at the top of the m-byte data.

Figures 12A, 12B:
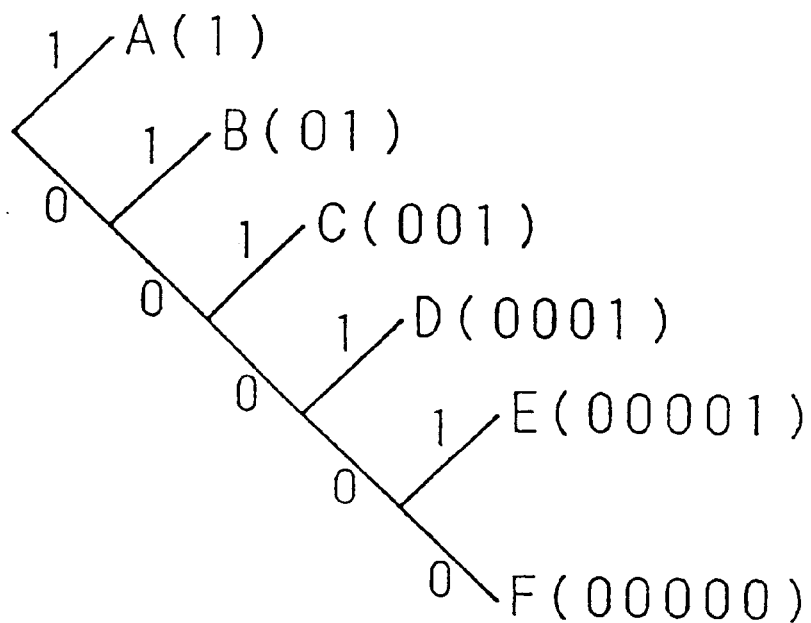
FIG. 12 is a diagram showing an example of a conventional variable-length encoding table.
Figure 13:
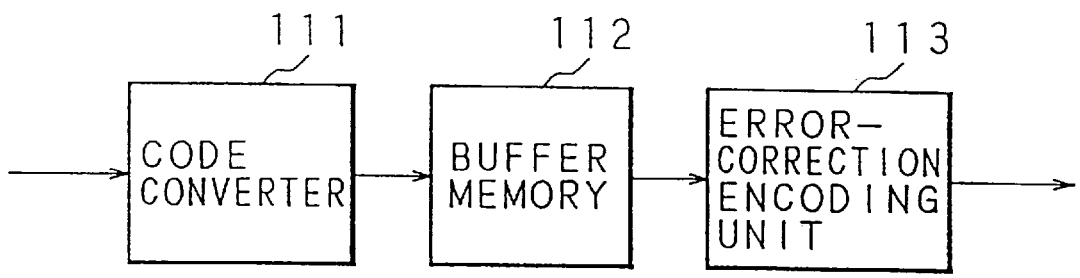
FIG. 13 is a block diagram showing the configuration of a conventional encoder.
Figure 33:
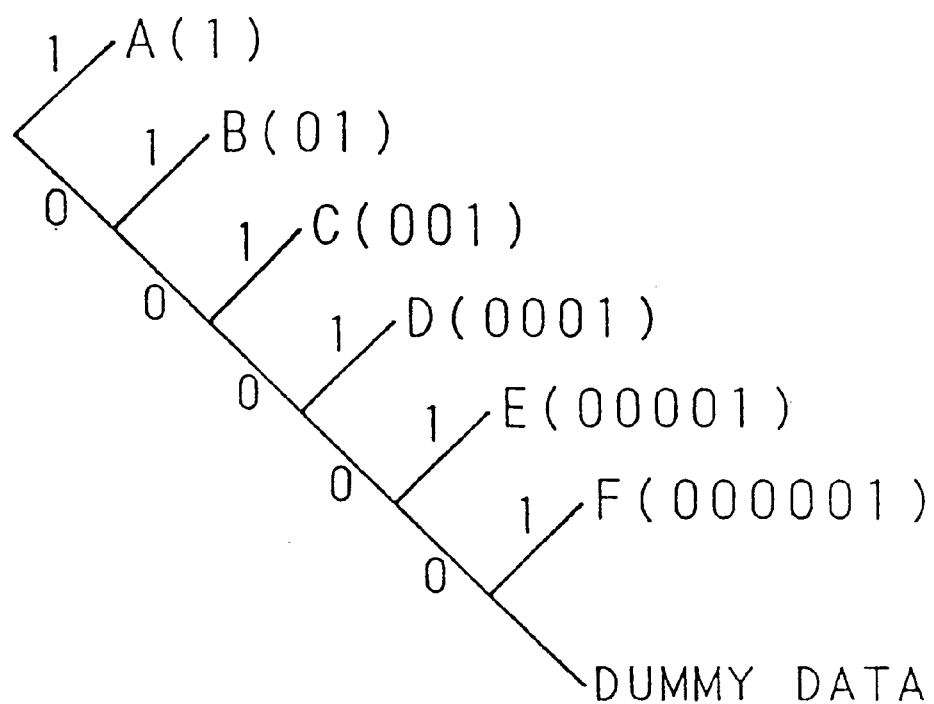
FIG. 33 is a diagram showing an encoding table in the encoder of the fourth embodiment.

In the above description, the data of all 0s is inserted into the blank portion. This requires an improvement in the preparation of an encoding table. That is, an encoding table is so prepared that no symbol corresponding to all 0s actually exists. This will be described with reference to FIG. 33 which shows a variable-length encoding table for variable-length encoding the same symbols as FIG. 12. In FIG. 12, 00000 is assigned to the symbol F. By contrast, in FIG. 33, one symbol called a dummy data is added, and a symbol becoming all 0s is assigned to this dummy data. The premise for the fourth embodiment is to perform the variable-length encoding on the basis of such a variable-length encoding table. Although this special dummy data of all 0s is included in the variable-length encoding table, it is not necessary for the dummy data to be all 0s. A branch conversion of FIG. 12 expressed by a binary tree may be conducted so that a data of all 1s becomes the dummy data. It is not necessary that all have the same value, and any value may used as far as an arbitrary bit from the top of a symbol to which the dummy data is assigned never coincides with any code for another symbol and of the same bit number. When the dummy data is 1s, the data of 1 may be written into all of m×n bytes during the above-mentioned initialization.

Then, the operation of the decoder with respect to this encoder will be described. In a very special case such as a special reproduction, in this encoder the top of m bytes is always the leading bit of a variable-length code, and therefore in an available C1 block the start of the variable-length decoding may be set at every m bytes. This is because with respect to the special code at the tail portion of the m bytes there exists no corresponding symbol. Specifically, there exists no corresponding symbol. Specifically, there exists no symbol corresponding to the data of the last 2 bits of 00 in FIG. 32 and it is ensured that the top of the next m bytes is that of the variable-length encoding of another symbol, and hence this 2-bit data of 00 can be abandoned. That is, the decoding can be achieved by providing a data-abandoning circuit that recognizes the boundary of m bytes and abandons the data in which the variable-length decoding has not succeeded at the last time. Moreover, this data-abandoning circuit can be realized as a circuit which generates a bit mask for prohibiting the inverse conversion of an inverse code converter. If this data-abandoning circuit is not provided, when decoding consecutive C1 blocks, a special data of the preceding C1 block is not abandoned to remain in the inverse code converter, and there arises a new problem in that this data together with the leading data of the next C1 block changes to the data of another symbol. When the last data of 2 bits of 00 is not abandoned and remains to exist and the next data is a variable-length code of 1 which corresponds, for example, to the symbol A, the inverse code conversion on the data of 001 is realized by the inverse code converter, with the result that it becomes the symbol C to cause the problem of a changed symbol. The aforesaid decoder is an example of a sixth embodiment described below.

(Fifth Embodiment)

Figure 34:
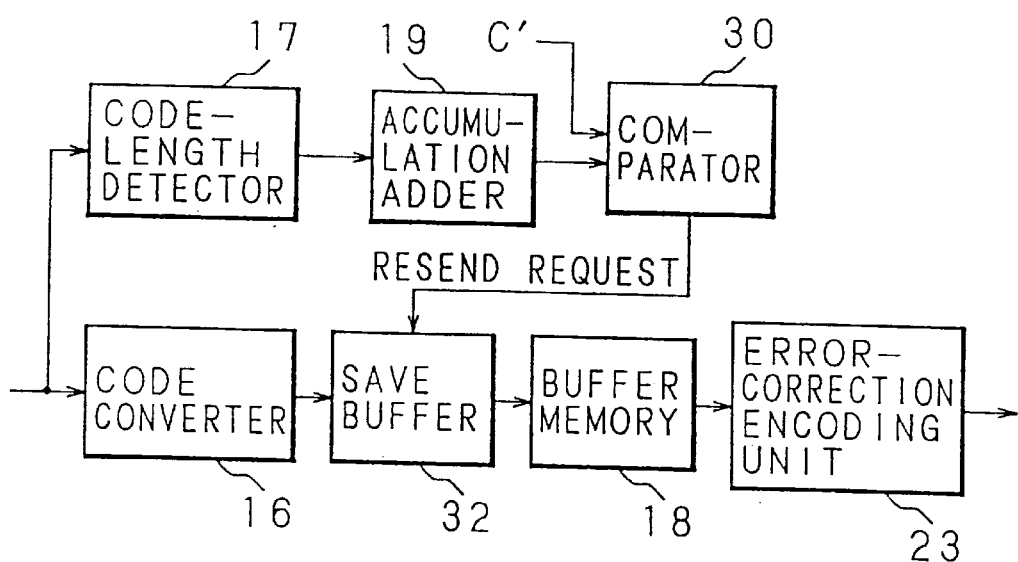
FIG. 34 is a block diagram showing the configuration of an encoder according to a fifth embodiment.

FIG. 34 is a block diagram showing the configuration of an encoder according to a fifth embodiment. In the figure, the portions which are designated by the same numerals as the encoders of the above-described embodiments indicate the identical or corresponding portions.

Input data are variable-length encoded by the code converter 16 and temporarily stored in the save buffer 32. On the other hand, the code-length detector 17 detects the generated code length, and the generated code length counted by the accumulation adding in the accumulation adder 19 is input into the comparator 30. The comparator 30 compares the generated code length with a constant C', and sets a resend request flag in the save buffer 32 when the generated code length exceeds the constant C'. When the resend request flag is input from the comparator 30, the variable-length code is read out again from the save buffer 32 in the sequence starting with the top of the code. This will be described specifically by illustrating an example. For example, in FIG. 32, the data positioned after that of 0001 (symbol D) is controlled to a fixed length in the m-byte length, and therefore there remains a margin of 2 bits. If it is assumed that the next symbol to be code-converted is E, two bits starting from the leading bit of E, i.e., 00 at the first two bits of the code of 00001 is put after the symbol D of 0001. When the resend is not requested immediately after this operation, 001 at the remaining 3 bits of the symbol E of 00001 is disposed at the top of the next C1 block of m bytes. Since the comparator 30 detects the full state of the C1 block caused by adding 00 of the first two bits of the code of 00001 and sets the resend request flag, however, the save buffer 32 operates so that the data of 00001 of the symbol E is read out again in the next C1 block in the sequence starting with the leading bit. That is, the leading 2 bits of the symbol E are disposed at the margin bits of the C1 block, and the leading 5 bits of the symbol E are disposed in the next C1 block. Although the leading 2 bits duplicate in this example, it is ensured that the top of the C1 block is the top of a variable-length code.

(Sixth Embodiment)

Figure 35:
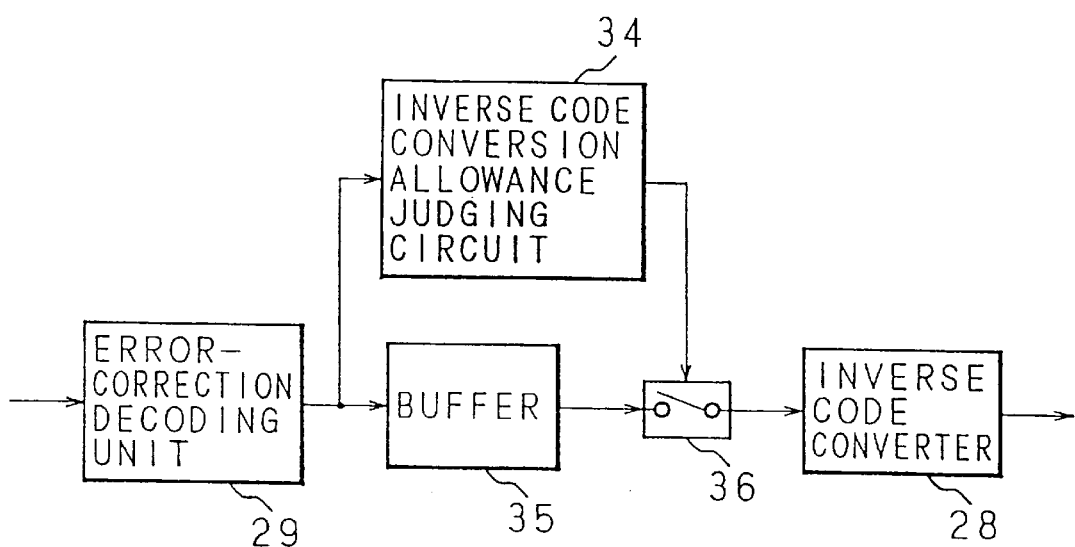
FIG. 35 is a block diagram showing the configuration of a decoder according to a sixth embodiment.

FIG. 35 is a block diagram showing the configuration of a decoder according to a sixth embodiment. In FIG. 35, 34 designates an inverse code conversion allowance judging circuit which judges, on the basis of the output, from the error-correction decoding unit 29, whether or not the decoding is accomplished; 35 is a buffer which stores the output of the error-correction decoding unit 29; and 36 is a switch of the ON/OFF operation, which is controlled by the inverse code conversion allowance judging circuit 34.

Next, the operation will be described. The basic principle of the operation is the same as that of the decoder corresponding to the encoder in the fourth embodiment, and therefore its description is omitted. The input of FIG. 35 is a signal which is obtained by passing data encoded in an encoder through a transmission medium. After errors which have been caused in a transmission channel are detected and corrected by the error-correction decoding unit 29, the input signal of FIG. 35 is output in the form of codes in the unit of minimum m bytes to the inverse code conversion allowance judging circuit 34 and also to the buffer 35, and temporarily stored in the buffer 35. On the other hand, the inverse code conversion allowance judging circuit 34 monitors each of the leading one bit of m-byte data and judges whether or not the variable-length decoding (inverse code conversion) can be accomplished. If it is judged that it can be accomplished, the switch 36 is turned ON, and the variable-length code in which it can be accomplished is read out from the buffer 35, and the inverse code converter 28 sequentially performs the variable-length decoding on each of the symbols. Although the procedure of processing the tail of m bytes in the encoder of the fourth embodiment is different from that in the encoder of the fifth embodiment, the data may be abandoned in both the cases, when the procedure of processing the data of m bytes is ended while the variable-length decoding of the tail is not accomplished. In the sixth embodiment, the switch 36 remains in the OFF state when the variable-length decoding is not accomplished, so that a variable-length code is not sent to the inverse code converter 28. Therefore, the sixth embodiment operates so that, while the process of the data of m bytes is ended or the switch 36 is in the OFF state, all of the m-byte data are initialized and the next m-byte data is stored. According to this, it is possible to achieve the same operation as the above-described data-abandoning circuit.

In the fourth embodiment described above, the encoding table is prepared with introducing improvement in its preparation and a special code is inserted in a margin. Further, the fifth embodiment performs the encoding without conducting such operations and with conducting operations in the next C1 blocks. According to the decoder of the sixth embodiment, however, it is possible to perform the decoding without causing the problem of a changed symbol. This decoding requires similar operations to be conducted in not only a trick play mode but also during a normal transmission.

(Seventh Embodiment)

Figure 36:
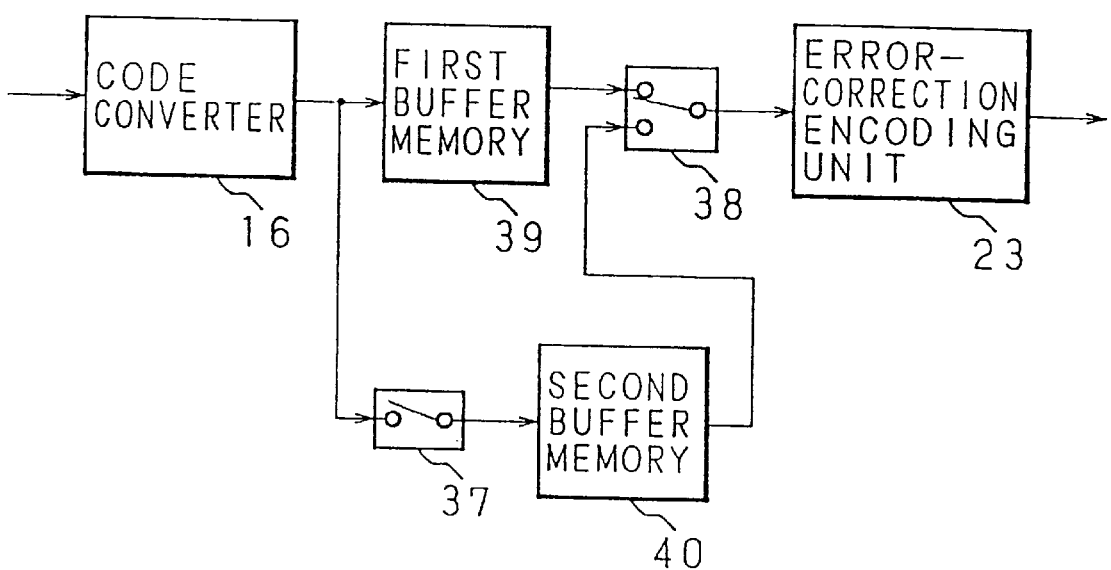
FIG. 36 is a block diagram showing the configuration of an encoder according to a seventh embodiment.

FIG. 36 is a block diagram showing the configuration of an encoder according to a seventh embodiment. In FIG. 36, 37 designates a switch which turns ON only when a special data is input into the code converter 16, 39 a first buffer memory which stores the output of the code converter 16, 40 a second buffer memory which stores data input through the switch 37, and 38 a switch which switches the outputs of the first and second buffer memories 39 and 40.

Next, the operation will be described. Input signals are variable-length encoded by the code converter 16m and stored in the first buffer memory 39. On the other hand, when a special data is to be encoded, the switch 37 is turned ON so that the special data is stored in the second buffer memory 40. The switch 38 is normally connected to the upper side (the side of the first buffer memory 39). However, when a specific position of the m×n bytes is pointed out, the switch 38 is connected to the lower side (the side of the second buffer memory 40) so that the reading out of the second buffer memory 40 is started. The contents of a certain fixed data length of the second buffer memory 40 are time-division-multiplexed and then supplied to the error-correction encoding unit 23. Naturally, the reading out of the second buffer memory 40 is conducted only when the switch 38 is connected to the lower side, and during this period the reading out of the first buffer memory 39 is stopped. When the connection of the switch 38 is changed, the reading out of the buffer memory 39 is started from the address at which the reading out has been stopped, and the reading out of the second buffer memory 40 is stopped.

Figure 14:
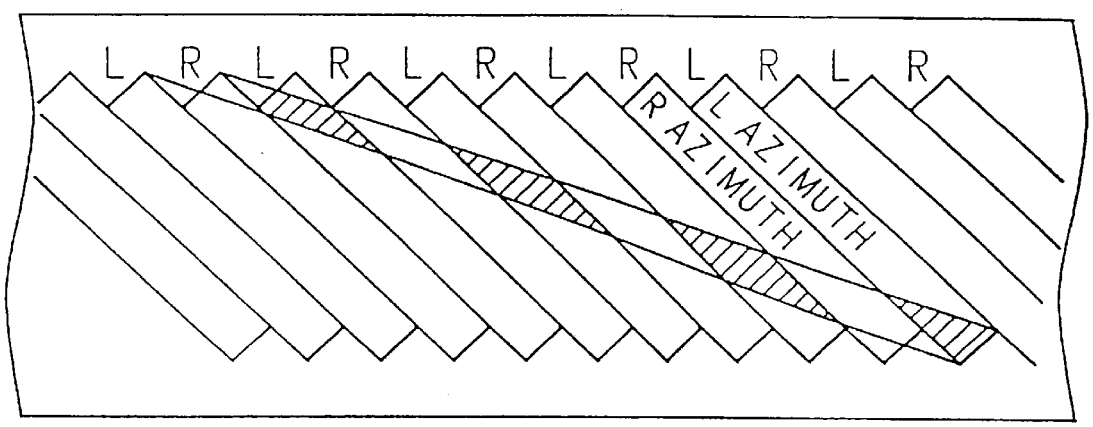
FIG. 14 is a diagram showing a locus of a head trace in a trick play state.
Figure 15:
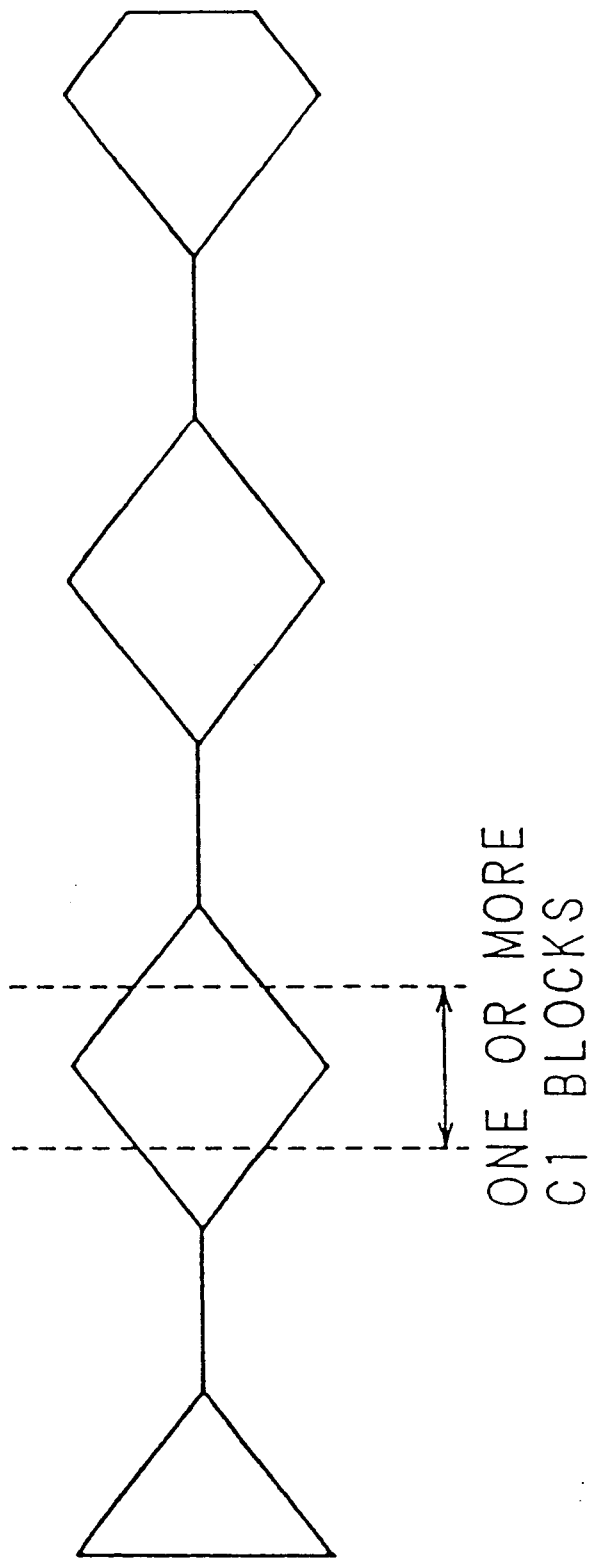
FIG. 15 is a diagram showing an example of a reproduction envelope obtained when a high speed reproduction is done in a tape recorder of the helical scan type.

Specific examples of cases in which the switch 37 is turned ON will be described. When a video signal is to be encoded, generally the DCT is performed and the DCT coefficient is variable-length encoded. Usually, a lower sequence of the DCT coefficient has a more important meaning, and therefore it is possible to obtain a rough recognition of an image using only a lower sequence. If in such a case the switch 37 is operated to turn ON so as to send only the results of encoding the lower sequence, the data of the lower sequence becomes an image which is double-drawn in a time-axis multiplex state. In an extreme case, the lower sequence may consist of a DC component only, and it is possible to understand a scene formed by a DC component only, and therefore a DC component only is double-drawn. Since, in view of a transmission capacity, it is preferable that the amount of data to be double-drawn is as small as possible, the encoding may be performed only on the upper some bits of the DC component. In such a case, however, the encoder may be so configured that the fixed length code before the code conversion is connected to the switch 37. In a scan type such as the NTSC system or PAL system, signals of the odd and even fields in one frame are similar to each other. Therefore, a calculation means for obtaining the sum of DC components in the fields may be provided, or a calculation means for obtaining a mean value of DC components of four DCT blocks en bloc may be provided and the calculation results may be stored in the second buffer memory 40. For example, the operations of averaging DC components of four DCT blocks en bloc, obtaining the sum of the fields, rounding it to 5 bits and storing it in the second buffer memory 40 allow basic data of an image to exist with the code amount of about 3% of all the data (excluding error-correcting codes). When this data is time-axis multiplexed so as to be positioned in the hatched portions of FIG. 14, it is possible to obtain this basic data with a certain constant high speed reproduction. According to calculations, data can be arranged so that a 20-fold or less super high speed reproduction can reproduce this data. It is not necessary that the double-drawn data is written in all frames. Encoding results obtained from only one of several tens of frames are stored in the second buffer memory 40, and the switching operation of the switch 38 is conducted in such a manner that they are gradually time-axis multiplexed during the time period corresponding to the several tens of frames and allows the data to be arranged so as to be reproduced in a super high speed reproduction. Furthermore, a suitable combination of the above-described examples, such as that the encoding is performed on up to a sequence which is somewhat lower but higher than the DC components of only one of several tens of frames, may be used.

In the description above, special reproductions are mainly described, but it is apparent that when a non-correctable error occurs it may be used in the interpolation wherein the error data is interpolated on the basis of the double-drawn data. For example, a method which employs data of the DC components may be used.

(Eighth Embodiment)

Figure 37:
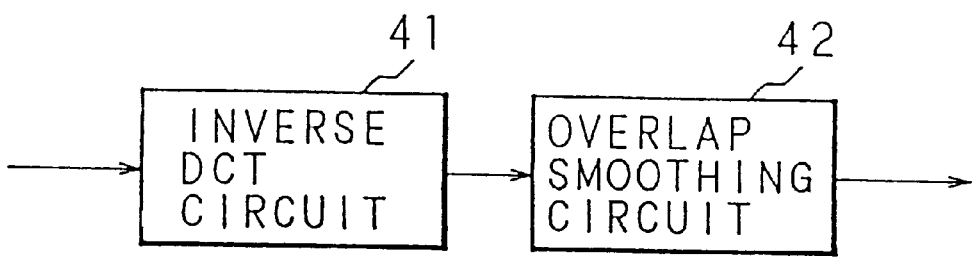
FIG. 37 is a block diagram showing the configuration of characteristic portions of a decoder according to an eighth embodiment.

FIG. 37 is a block diagram showing the configuration of characteristic portions of a decoder according to an eighth embodiment. In FIG. 37, 41 designates an inverse DCT circuit which performs the inverse DCT only on input DC components, and 42 an overlap smoothing circuit which makes the boundary of blocks inconspicuous.

Figure 38A:
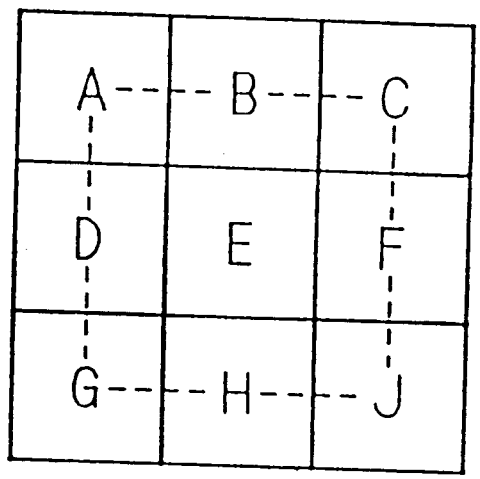
FIGS. 38(A) and 38(B) are diagrams showing the operation of the eighth embodiment.

Next, the operation will be described. This embodiment differs from a conventional decoder in that it has a mode in which, when it enters in an operation state such as a super high speed reproduction, an image is decoded only from double-drawn data. The approach method slightly varies according to the kind of data which has been double-drawn during the encoding. For example, in a case that the DC components only are double-drawn in the encoder of the above-described seventh embodiment, only one data exists for each DCT block (or for every four DCT blocks), and therefore the boundary of DCT blocks can be clearly detected, and the boundary of blocks has a rectangular shape. Hence, it rather obstructs the scene recognition of an image. A circuit for reducing it is shown in FIG. 37. The inverse DCT circuit 41 performs the inverse DCT only on DC components to obtain a block-shaped image as shown in FIG. 38(A). In FIG. 38(A), eight blocks A–J with the block E as the center are shown. The size of the block E coincides with the DCT block size (usually, 8×8 pixels) when data of each block of the DCT are double-drawn, and to the 4-DCT block size when the DC mean value of 4 DCT blocks is appended. After these data which produce a block-shaped reproduction display are obtained, the overlap smoothing circuit 42 makes the boundary of blocks inconspicuous, thereby obtaining basic data which will be output to a TV monitor as a super high speed reproduction display.

Figure 38B:
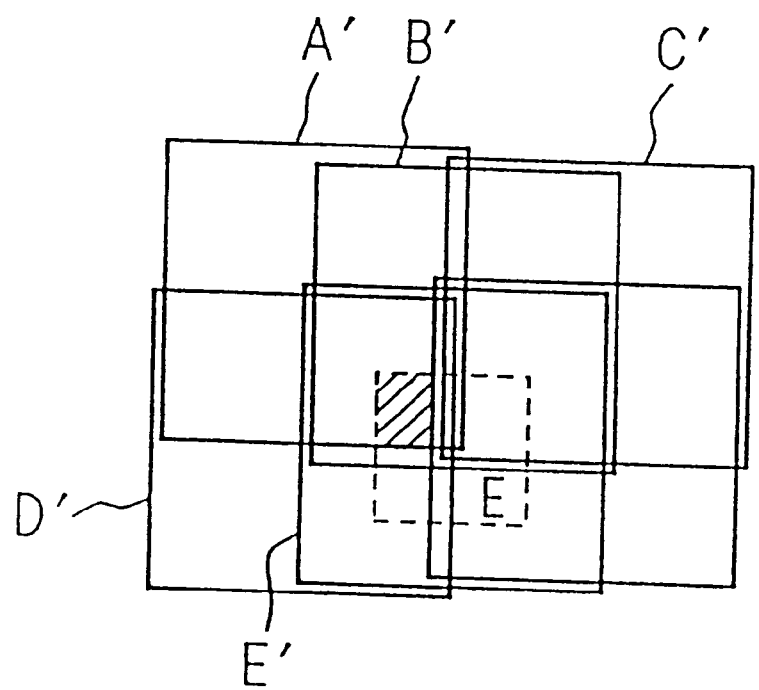

Hereinafter, the operation of the overlap smoothing circuit 42 will be described. It is assumed that, for example, the decoded data of each of the blocks A–J in FIG. 38(A) is a block in which the block of itself is expanded to be quadrupled in area and doubled in length, centering around itself. This causes the nine blocks of FIG. 38(A) which are compactly arranged, to overlap, with the result that the blocks overlap as shown in FIG. 38(B). A' of FIG. 38 (B) is a block which is obtained by expanding A of FIG. 38(A), and B', C', D' and E' indicate blocks which are obtained by expanding B, C, D and E, respectively. The manner of processing under such a state the value of the hatched portion of, for example, block E (indicated by dotted lines in FIG. 38(B)) to make the block boundary inconspicuous will be illustrated. The part of the hatched portion of FIG. 38(B) which is in the vicinity of the center of block E allows block E to pass as it is, and the part which is in the vicinity of the boundary of block E reduces by half the data of block E, and averages them so as to be added with the overlap portion from other blocks. Specifically, block E' is multiplied by a window function such as a sine function and added to the data of the overlap portion. In this case, attention must be paid so that the addition of the overlap portion does not cause the expansion of the dynamic range. Namely, attention is paid so that the result of the multiplication of a function having the value equal to or less than 1 and the addition is prevented from becoming 1 or more.

Furthermore, the same effect can be achieved by performing the inverse DCT as a smoothing means other than overlap smoothing, so as to interpolate its DCT coefficient from the DCT coefficients of adjoining blocks such as shown in FIG. 39(A). An example of interpolating the next higher sequence, for example, only from DC components will be illustrated below. For example, the component $C_{21}$ (shown in FIG. 39(B)) of block E is obtained by subtracting the DC component of block H from the DC component of block B and by multiplying a certain coefficient P($\square$–), and the component $C_{12}$ by subtracting the DC component of block F from the DC component of block D and by multiplying the coefficient P. In view of the basis function of the DCT, it will be understood that such an interpolation can be well done.

(Ninth Embodiment)

Figure 40:
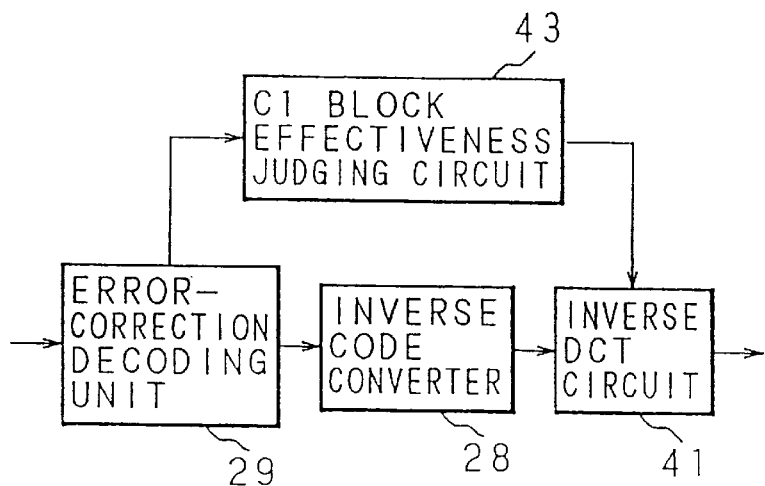
FIG. 40 is a block diagram showing the configuration of a decoder according to a ninth embodiment.

FIG. 40 is a block diagram showing the configuration of a decoder according to a ninth embodiment. In FIG. 40, 43 designates a C1 block effectiveness judging circuit which judges whether or not each C1 block is effective.

Then, the operation will be described. For example, the encoder of the foregoing embodiment adds an errorcorrecting code to a fixed-length data, and hence if there is no error in the unit of an error correction block it can perform the variable-length decoding without changing a symbol. On the contrary, when the variable-length decoding is performed after the blocking as in the case of encoding a video signal, an EOB code always exists. Unless such a code is decoded, DCT coefficients which are to be subjected to the inverse DCT are not completed. When the C1 block effectiveness judging circuit 43 detects that an error has occurred in a C1 block, for example, the process may fail to reach an EOB code. In such a case, "O" is inserted into the remaining sequences and the inverse DCT is performed, thereby obtaining a reproduced image. This allows the final block to be decoded for the time being, and moreover the substitution of "O" prevents the higher sequences to be decoded to abnormal data.

(Tenth Embodiment)

Figure 41:
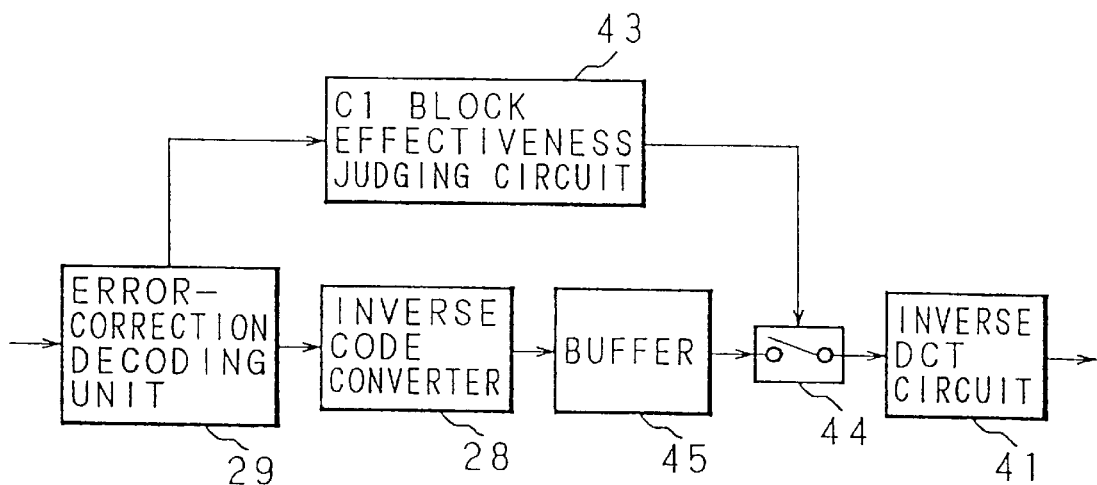
FIG. 41 is a block diagram showing the configuration of a decoder according to a tenth embodiment.

FIG. 41 is a block diagram showing the configuration of a decoder according to a tenth embodiment. In FIG. 41, 44 designates a switch, the ON/OFF operation of which is controlled by the C1 block effectiveness judging circuit 43, and 45 is a buffer which stores the output of the inverse code converter 28.

Next, the operation will be described. The operation of this circuit is very similar to the above-described ninth embodiment. When the C1 block effectiveness judging circuit 43 judges that an error remaining to be changed exists in the succeeding C1 block and when the process fails to reach an EOB code, the DCT coefficient of the DCT block which is stored in the buffer 45 and lacks the EOB code is abandoned by the OFF operation of the switch 44. As a result, it is possible to avoid an abnormal decoding result.

The ninth and tenth embodiments are specific examples in which it is premised that data of m×n bytes of variable-length codes of a video signal are continuously reproduced. When using an encoder such as the second or seventh embodiment in which information at a prefixed position among data of m×n bytes is replaced with another data, it is needless to say that such a data is not necessary to be connected to the inverse DCT circuit, that the configuration may be done so that such a data is shut off by the switching operation at that position.

Moreover, in the second to tenth embodiments, the double Reed-Solomon error correcting generally shuffles obtained data of m×n bytes to perform the error-correcting encoding. When there exists a case of performing the error-correction in the unit of C1 and the data is the variable-length encoding, however, it is preferable that the data shuffling is not conducted randomly. Furthermore, although the above-described embodiments deal with very limited encoding techniques, it is needless to say as mentioned above that the error-correcting code may be another code as far as it is to be added to data of a fixed length code, that the variable-length code may be a code other than the Huffman encoding (e.g., the Fano code), and that the DCT may be another orthogonal transform. There arises no serious problem even if the shuffling is conducted so as not to disturb the order of the variable-length code, e.g., in the unit of an EOB. Information indicative of the block position of a video signal may be time-axis multiplexed.

(Eleventh Embodiment)

Figure 42:
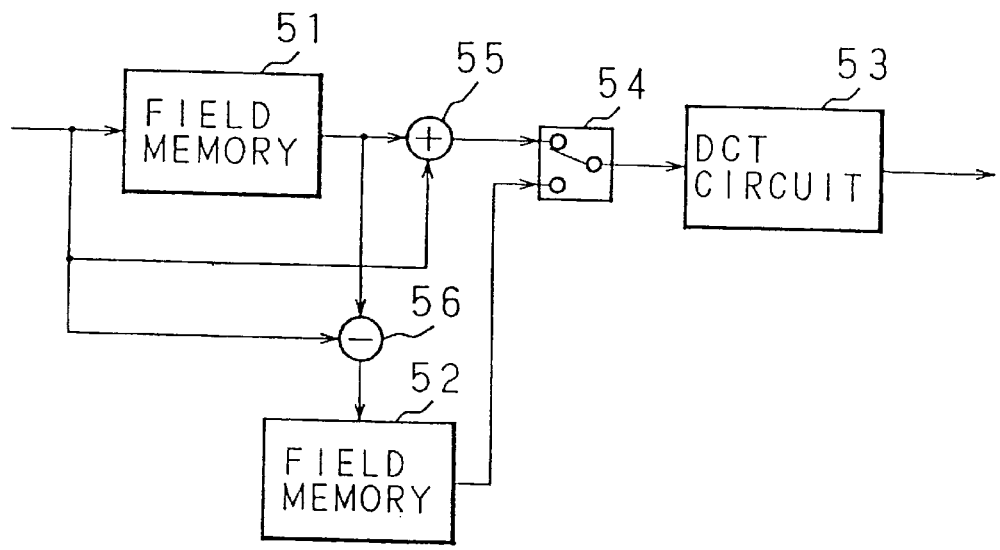
FIG. 42 is a block diagram showing the configuration of an encoder according to an eleventh embodiment.
Figure 51:
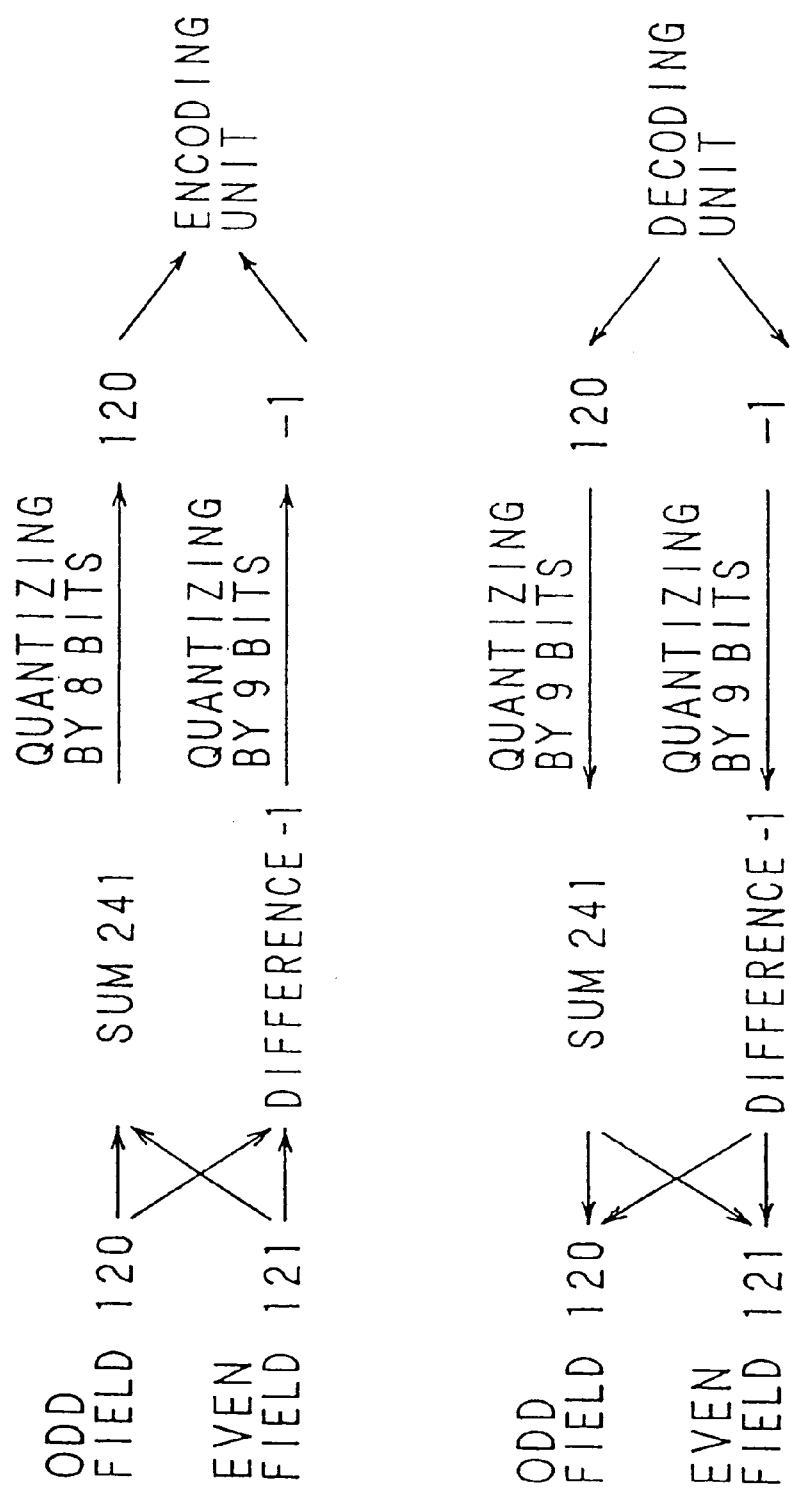
FIG. 51 is a diagram showing the algorithm of an encoder/decoder according to a fourteenth embodiment.

FIG. 42 is a block diagram showing the configuration of an encoder according to an eleventh embodiment. In FIG. 42, 51 and 52 designate field memories which output an incoming signal being delayed by one field, 55 an adder which adds the current input signal and the output (a signal delayed by one field) of the field memory 51, 56 a subtractor which calculates the difference between the current input signal and the output of the field memory 51, 54 a switch which switches the output of the adder 55 and that of the field memory 52, and 53 a DCT circuit which performs the DCT.

Then, the operation will be described. At first, an input signal is stored in the field memory 51 and delayed by one field. The adder 55 obtains a sum of signals which are different in time by one field. On the other hand, the subtracter 56 obtains a difference between signals which are different in time by one field, and it is supplied to the field memory 52 and read out therefrom, being delayed by one field from the output of the adder 55. The switch 54 switches at every field the output of the adder 55 and that of the field memory 52 so that the sum of fields and the difference between fields are switched at every field to be input to the DCT circuit 53. The components of the sum of fields and the difference between fields are subjected to the DCT process by the DCT circuit 53 and encoded.

Figure 20:
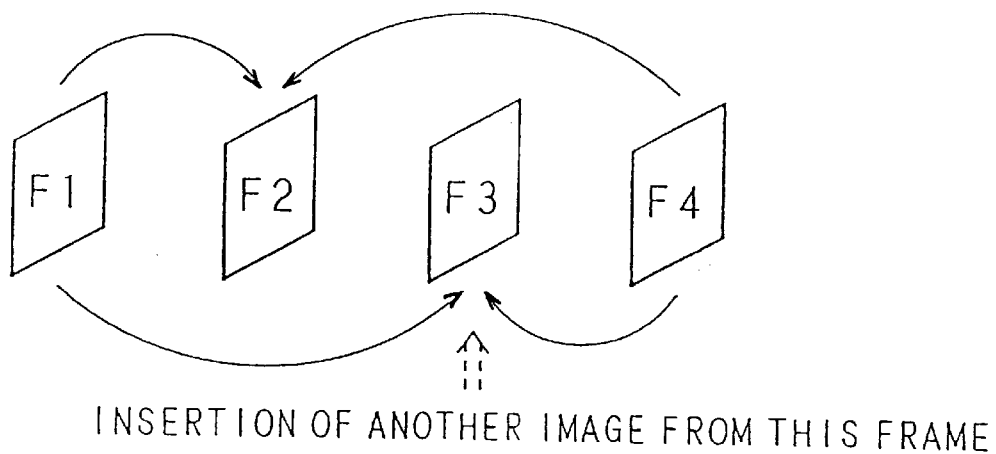
FIG. 20 is a diagram showing estimation between frames and editing requirements.
Figure 21:
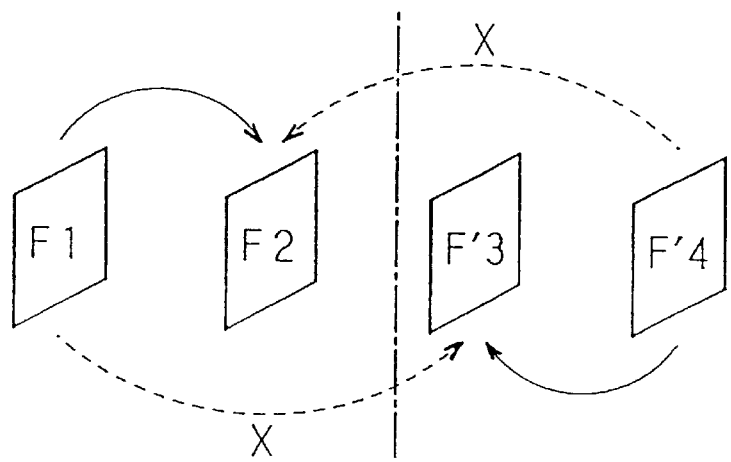
FIG. 21 is a diagram indicating a problem of a conventional encoder.

In this way, since only the calculation between fields in one frame only is conducted, the calculation between frames will not occur, thereby facilitating the operation of editing in the unit of one frame. Namely, when inserting F3' and F4' after F3 in FIG. 20, it is not required to encode again F1 and F2.

Figure 43:
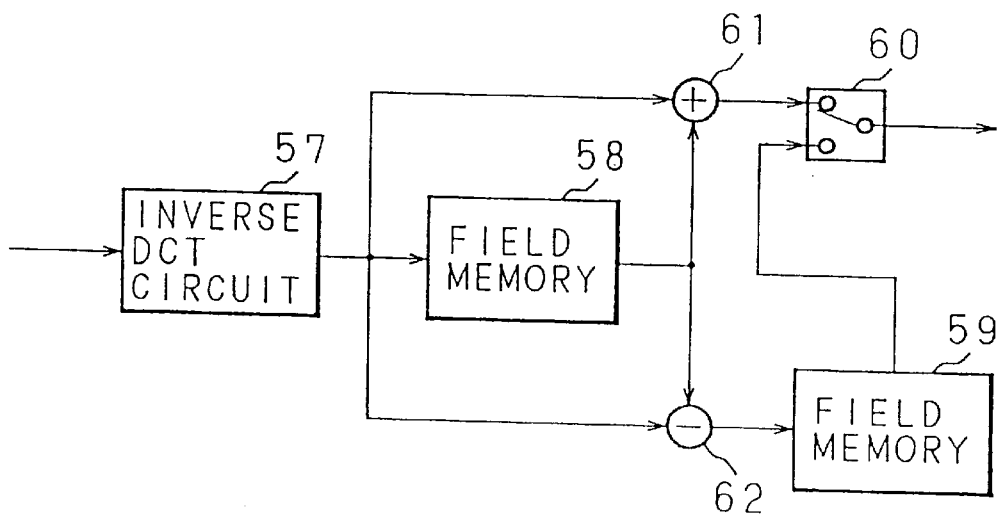
FIG. 43 is a block diagram showing the configuration of a decoder corresponding to the encoder of FIG. 42.

FIG. 43 shows the configuration of a decoder which operates in the reverse manner with respect to the above-described encoder, and 57 is an inverse DCT circuit, 58 and 59 field memories, 61 an adder, 62 a subtracter, and 60 a switch. The operation of this decoder is the entire inverse of that of the above-described encoder, and therefore its description is omitted.

Figure 44:
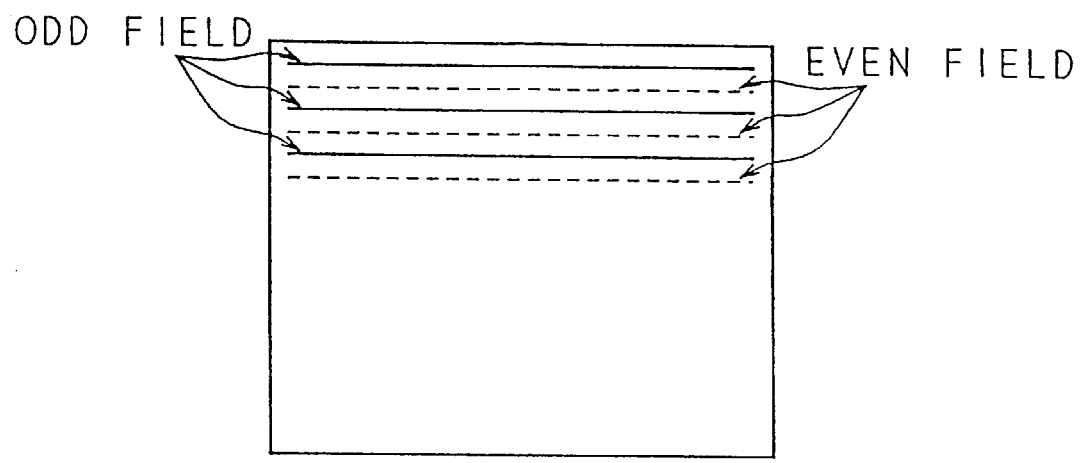
FIG. 44 is a diagram showing the interlace scan.

Hereinafter, with reference to FIGS. 44 to 48, the advantages of the encoder of the eleventh embodiment will be described. FIG. 44 is a scan system which is most widely used in current TVs and is called an interlace scan system. This system is configured so that one frame consists of two parts, the odd field and the even field which are scanned while being slightly shifted from each other. In point of time, the transmission of the odd field is followed by that of the even field, and therefore two fields which are of the substantially same signals exist in one frame. Signals of the odd field differ from those of the even field in the following three occasions: a case in which the vertical resolution of an image is high; a portion wherein a dynamic image moves; and noise components. Since the sum of fields is obtained in the eleventh embodiment, a portion wherein the vertical resolution of the display is low or a portion wherein the movement degree is small or a signal in which noises are flattened is output as the sum of fields and encoded. In this way, since the frequency distribution of the sum of fields is concentrated at a lower frequency region, when the DCT is performed, the encoding efficiency is higher in many cases than that of a case in which the sum of fields is not obtained. Moreover, when the image is not a dynamic image, the difference between fields is substantially zero, resulting in an encoding efficiency which is excellent.

Figure 45A:
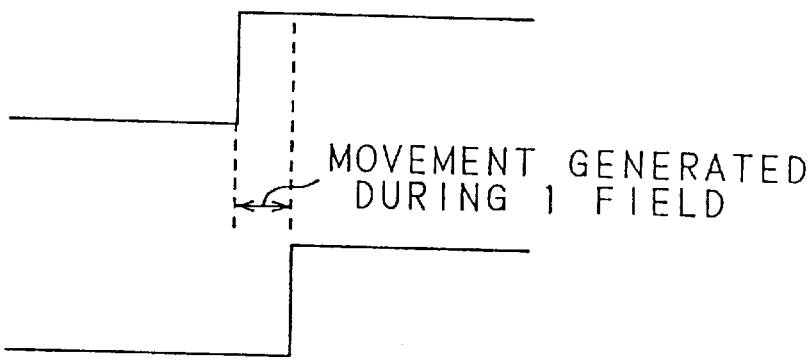
FIGS. 45(A) and 45(B) are diagrams showing the interlace structure of a dynamic image.
Figure 45B:
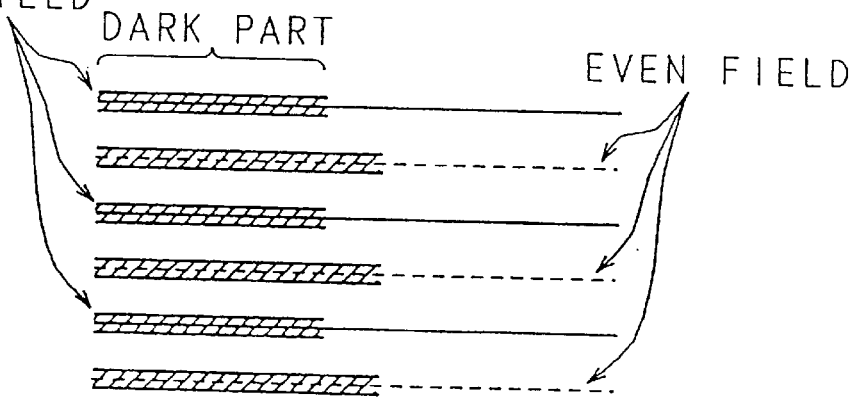
Figure 46:
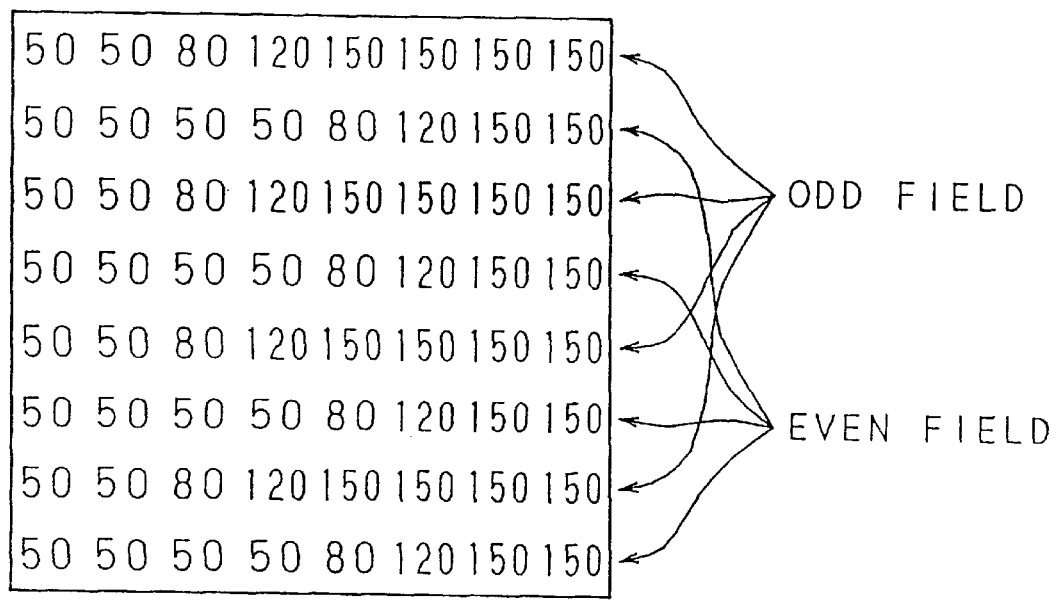
FIG. 46 is a diagram showing an example of data for illustrating an effect of the eleventh embodiment.

Next, a portion wherein a dynamic image moves will be described referring to FIGS. 45 to 48. FIG. 45(A) shows the states of fields which are produced by erroneously moving a step-shaped signal in the next field. The state of a TV screen displaying this is shown in FIG. 45(B). The generation of such a movement appears as an indentation when finely observing a TV screen, and this can be sensed as a movement owing to the afterimage effect of the eye. Data of such a signal can be expressed in figures as shown in FIG. 46. When these are subjected, as they are, to the blocking in the frame and then to the two-dimensional DCT, the result becomes as shown in FIG. 47. Further, when this is subjected as it is to the inverse DCT, the MSE (square root of the total sum of square errors) is 12.5. When those are subjected to the two-dimensional DCT after obtaining the sum of fields and the difference between fields, however, the figures shown in FIG. 48 are obtained. Further, when this is subjected as it is to the inverse DCT, the MSE is 8.9, showing that the DCT after obtaining the sum of fields and the difference between fields provides a better S/N ratio. Moreover, when comparing the figures of the results of the DCTs, it will be seen that the proportion of 0 occupying in the results obtained through the sum of fields and the difference between fields is overwhelmingly greater. This is very advantageous in the run-length coding, and shows that the entropy is low and that the generated code amount in the case of FIG. 48 is smaller. Although it appears that in FIG. 48 there are two 8×8 tables and the data amount is increased at a glance, the generated code amount is substantially reduced by the reduced amount of the entropy because the sum of fields and the difference between fields are selectively output at every field. Thus, the actual number of pixels is not increased. In this way, there are many cases in which the generated code amount is reduced also in a moving portion, and it can be said that the eleventh embodiment is a very efficient method.

Although in the above case in which the sum of fields and the difference between fields are selected at every field has been described as an example, needless to say, they may be selectively output at every block or at a plurality of blocks of the DCT. Further, it is not necessary for the orthogonal transform to be the DCT, since other orthogonal transforms such as the K-L transform can achieve the same effects.

(Twelfth Embodiment)

Figure 19:
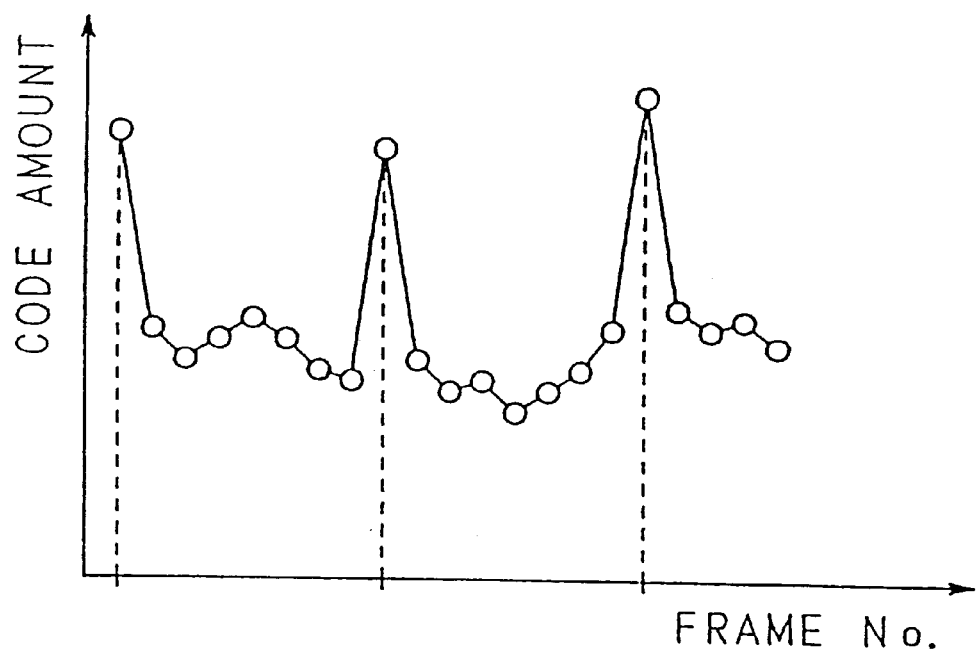
FIG. 19 is a diagram showing code amounts generated by a conventional encoder.
Figure 49:
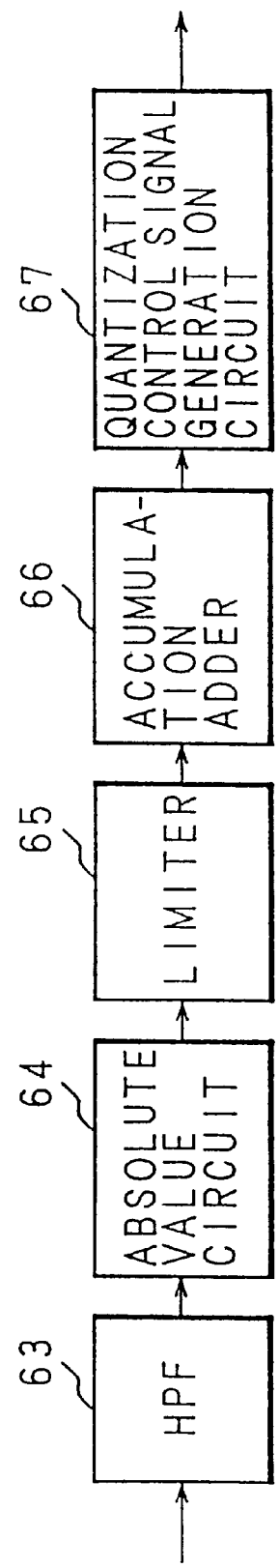
FIG. 49 is a block diagram showing the configuration of characteristic portions of an encoder according to a twelfth embodiment.

A twelfth embodiment is an example in which the configuration of FIG. 42 and that of FIG. 49 (a circuit for detecting the poorness of the S/N ratio of input video signals) are combined to control the quantization level of the difference between fields. In FIG. 19, 63 is a high-pass filter (hereinafter, "HPF") which limits the band, 64 an absolute value circuit which obtains the absolute value of an input signal, 65 a limiter which limits the amplitude, 66 an accumulation adder which performs the accumulative addition, and 67 a quantization control signal generation circuit which outputs to the encoder of FIG. 42 a control signal for controlling the quantizing bit number.

Next, the operation will be described. The circuit of FIG. 49 detects the poorness of the S/N ratio of a video signal and varies the quantizing bit number in the encoding of FIG. 42. Generally, noises are low-amplitude signals, and therefore when the quantizing bit number is rough they are buried in quantizing noises, whereby the increase of the code amount caused in the encoding by noises is eliminated. It is very effective against the increase of the code amount owing to noises because when the quantizing bit number is rough, the code amount is generally decreased. The input of FIG. 49 may be either of a signal of the difference between fields and a video signal. The input signal is passed through the HPF 63 to eliminate the effect caused by the low frequency components and the accumulative addition is done. Then, the absolute value circuit 64 obtains the absolute value of the input signal so that the value becomes greater when noises have a higher level. In order to prevent a high frequency video signal which originally has a high amplitude from causing an erroneous detection, the signal is passed through the limiter 65 to be subjected to the amplitude limitation, and thereafter the accumulation adder 66 performs the calculation of accumulative addition for a fixed period of time. The quantization control signal generation circuit 67 refers to the calculated value of the accumulation adder 66, and when the calculated value becomes equal to or greater than a predetermined value, the circuit 67 generates a control signal which makes the quantizing bit number rough. The control signal is sent to the encoder of FIG. 42.

In the above description, the code amount is prevented from increasing by making rough the quantizing bit number of the signal of the difference between fields. In addition to such a means, however, it may be so configured that the encoding is done after a so-called noise reduction in which high frequency components of the difference between fields are extracted and limited in amplitude and then subjected to the subtraction with the original difference between fields.

Furthermore, when controlling the quantizing bit number, the same effect may be achieved in the following two cases: the quantizing bit number for quantization is controlled before the DCT circuit 53; and the DCT coefficient is quantization-controlled after the DCT circuit 53.

(Thirteenth Embodiment)

Figure 50A:
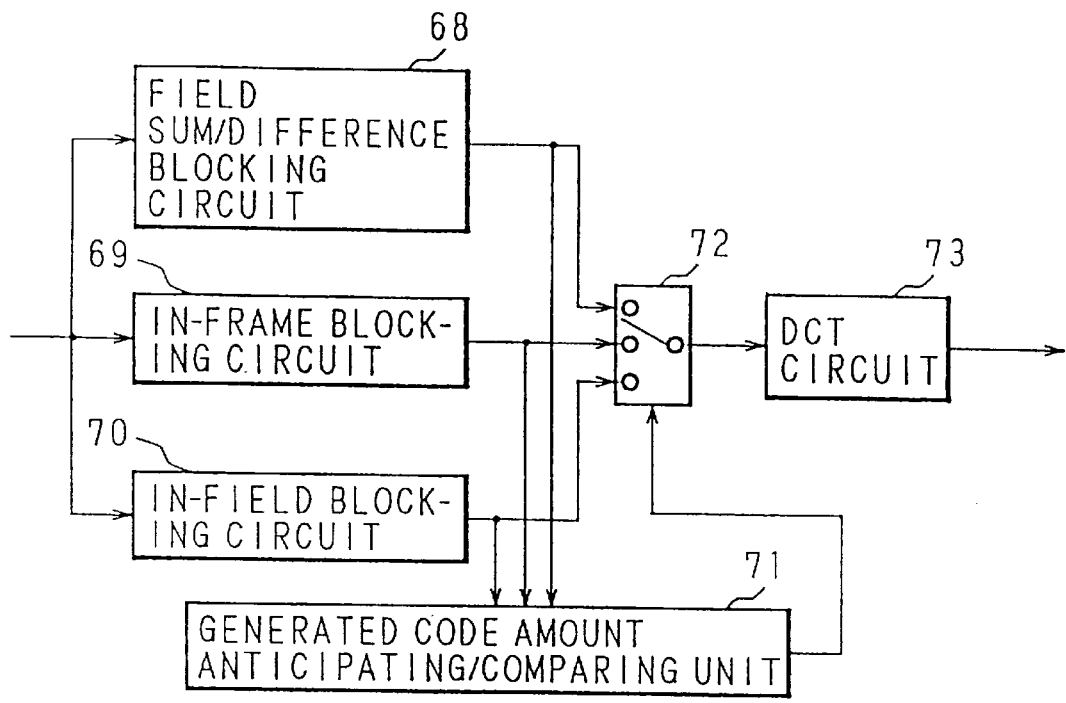
FIGS. 50(A) and 50(B) are block diagrams showing the configuration of an encoder according to a thirteenth embodiment.
Figure 50B:
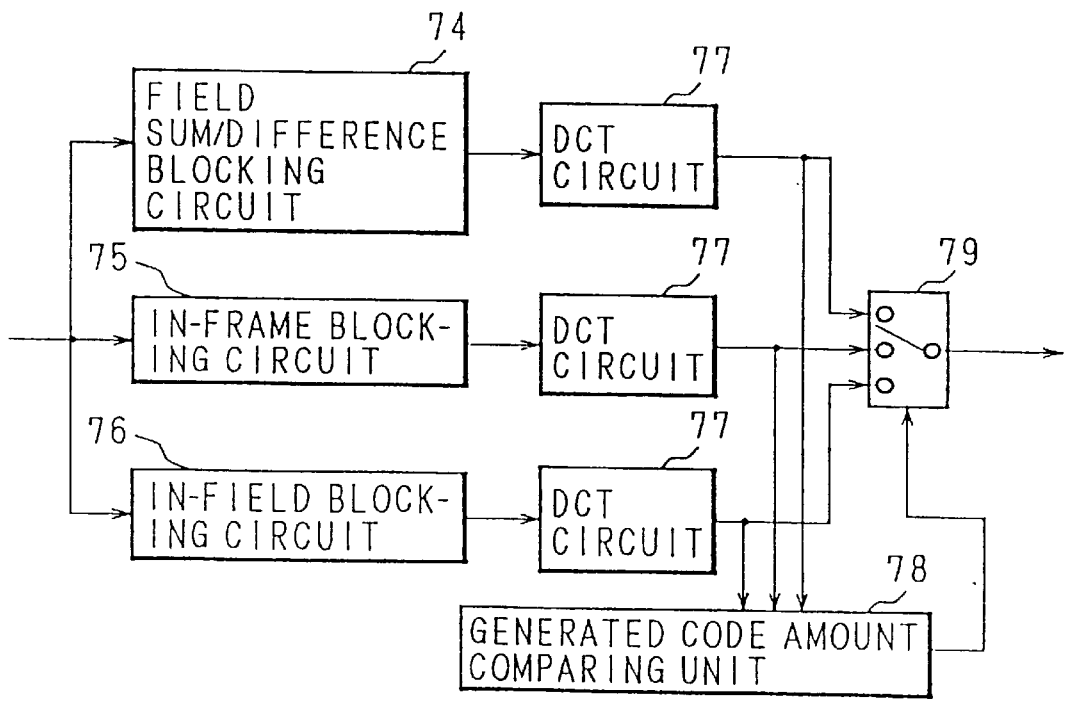

As described above, in very many cases, it is advantageous in the view point of encoding efficiency that the encoding is done by performing the DCT after obtaining the sum of fields and the difference between fields. When a still image has a high vertical resolution or a scene change occurs between fields, however, the above-mentioned encoding is not always advantageous. The optimum state for the encoding efficiency is that the blocking for the encoding is adaptively changed in accordance with such cases and the blocking most suitable for each case is selected. A thirteenth embodiment is an encoder which realizes such contents. FIGS. 50(A) and 50(B) show the configuration of the encoder of the thirteenth embodiment. In FIG. 50(A) showing the configuration of an example of the thirteenth embodiment, 68 is a field sum/difference blocking circuit, 69 is an in-frame blocking circuit, 70 is an in-field blocking circuit, 71 is a generated code amount anticipating and comparing unit which anticipates and compares the generated code amount on the basis of outputs from the blocking circuits 68, 69 and 70, 72 a switch which switches outputs from the blocking circuits 68, 69 and 70, and 73 a DCT circuit which performs the DCT. Also, in FIG. 50(B) showing another configuration of the thirteenth embodiment, 74 is a field sum/difference blocking circuit, 75 is an in-frame blocking circuit, 76 is an in-field blocking circuit, 77 are DCT circuits which perform the DCT, 78 is a generated code amount comparing unit which compares the generated code amount on the basis of outputs from the DCT circuits 77, and 72 a switch which switches outlets from the DCT circuits 77. FIG. 50(A) is an embodiment in which the DCT circuit 73 is commonly owned and the blocking state is switched by the switch 72, and FIG. 50(B) is an embodiment in which outputs of the DCT circuits 77 are switched by the switch 79. Both the embodiments perform the switching operation so as to minimize the code amount, and hence the encoding efficiency is always optimum. This switching criterion may be realized by various embodiments, and in the block diagrams shown as the generated code amount anticipating and comparing unit 71 and the generated code amount comparing unit 78. According to the specific embodiment, for example, in the anticipation of the generated code amount, a case wherein an edge and a transient coexist in the block may be detected, and the combination of an HPF and LPF enables the judgment to be done. In the generated code amount comparing unit 78, for example, a method may be conducted in which an output having the largest number of DCT coefficients having the value of 0 is selected.

Although in the above description the three states of the blocking are switched, needless to say, only two of them may be switched.

(Fourteenth Embodiment)

This fourteenth embodiment is an embodiment illustrating the allocation of the quantizing bit number before the DCT process after the field sum/difference for a high-fidelity encoding/decoding. FIG. 51 shows its example. In FIG. 51, it is assumed that the value of a pixel of the odd field and that of the even field corresponding to it are 120 and 121 (since they are 8-bit data, a value of 0 to 255), respectively. When the sum of fields is obtained, it is 241, and the difference between fields is 120–121=–1. In this instance, the dynamic range of the data of the sum of fields is 9 bits of 0 to 511, and the dynamic range of the data of the difference between fields is 9 bits of –255 to 255. Then, the sum of fields is made 8 bits by rounding off (rounding) the least significant bit to become 120, and while the difference between fields remains to be 9 bits the DCT is performed to encode. Supposing that no error is produced in the encoding and decoding units, the output of the decode unit is as follows: the sum of fields is 120; and the difference between fields is –1. By adding one bit of 0 to the place subsequent to the least significant bit of the sum of fields, a figure of 240 is obtained. As compared with the figure of 241 at the encoding, this produces an error of 1. If this remains to continue, decoding results of a low fidelity are obtained.

In this case, the difference between fields is an odd number, and therefore it indicates that either of the odd field or the even field is an odd number. Since the difference between fields has a data of –1, moreover, it is known that the data of the even field is greater by 1. As such data, there exists only one combination of 120 and 121. For example, in the combination of 119 and 120, when the sum of fields is made 8 bits, it becomes 119, and, in the combination of 121 and 122, when the sum of fields is made 8 bits, it becomes 121. That is, when the sum of fields made in 8 bits is a and the 9-bit difference between fields is b, the data of an input signal are decoded with excellent fidelity by performing a set of calculations such as shown in FIG. 52.

In the above, an example in which the sum of fields is quantized with a bit number reduced by one has been described. In contrast with this, the difference between fields may be quantized with a bit number reduced by one, thereby obtaining field data which correspond one-to-one as shown in FIG. 52. In this way, even if the bit number of either of them is reduced by one, encoding results of a high fidelity can be obtained, thereby enabling the encoding of a high S/N ratio. Needless to say, the above is not required to use the orthogonal transform as far as the encoding of a high fidelity is obtained.

(Fifteenth Embodiment)

Figure 53:
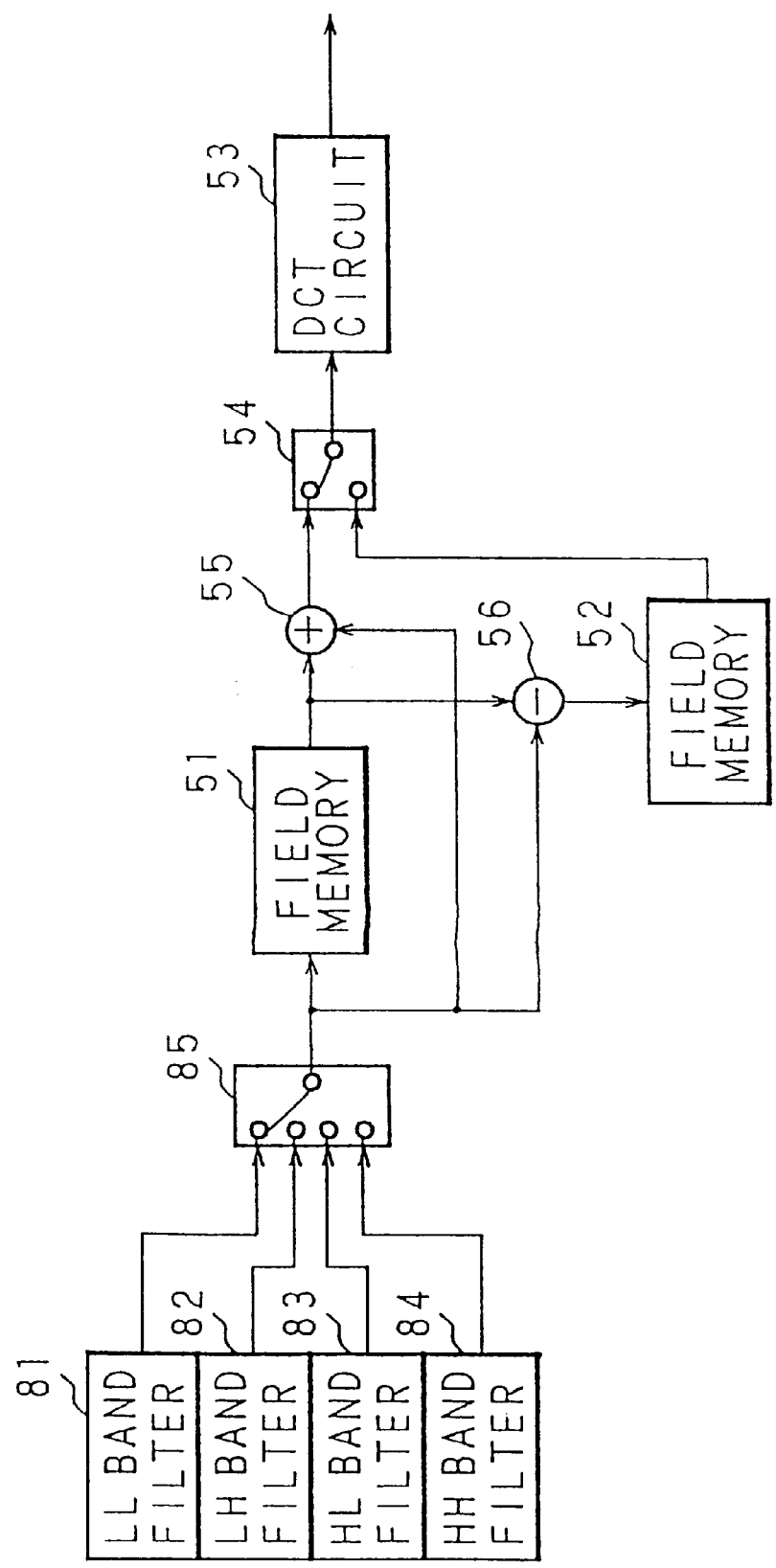
FIG. 53 is a block diagram showing the configuration of an encoder according to a fifteenth embodiment.

FIG. 53 is a block diagram showing the configuration of an encoder according to a fifteenth embodiment. After the band-division of a video signal, the fifteenth embodiment obtains the sum of fields and the difference between fields to perform the encoding. The numerals 81, 82, 83 and 84 in FIG. 53 are band-division and thinning filters which use a QMF (orthogonal mirror filter) bunk, etc., and 85 a switch which switches the outputs of the filters 81–84. The other configuration is the same as the eleventh embodiment shown in FIG. 42, and the identical portions are designated by the same reference numerals and their description is omitted. The LL band filter 81 extracts a low-frequency band signal in both the horizontal and vertical, the LH band filter 82 extracts a low-frequency band signal in the horizontal and a high-frequency band signal in the vertical, the HL band filter 83 extracts a high-frequency band signal in the horizontal and a low-frequency band signal in the vertical, and the HH band filter 84 extracts a high-frequency band signal in both the horizontal and vertical. The filters 81–84 have the characteristic that the area caused by the thinning operation is canceled in the synthesizing process, and are very convenient to perform the band-division and encoding.

Then, the operation will be described. A two-dimensional image is subjected by these filters 81–84 to the band-division, and the sum of fields and the difference between fields are obtained, and they are passed through the DCT circuit 53 to be encoded. In this instance, for example, the use of the characteristics of the human visual information processing can further improve the encoding efficiency without making the deterioration of the visual sensation prominent. Namely, human eyes have a narrow dynamic range for high frequency components, and hence cannot detect them even when the quantization level is set rough. Even when the high frequency components separated by the QMF are subjected to the DCT and roughly quantized, the employment of the above causes their deterioration to be substantially undetectable, whereby apparent deterioration is almost prevented from being detected. Since the decrease of the code amount caused by the rough quantization level can be expected, therefore, it is effective. Furthermore, even when the quantization level is set fairly rough, it is impossible to detect the deterioration of the components of the difference between fields of the high frequency components. Namely, in the fifteenth embodiment, the components of the difference between fields of the high frequency components are roughly encoded using the QMF, thereby accelerating the decrease of the code amount while maintaining the characteristics of the visual sensation.

INDUSTRIAL APPLICABILITY

As described above, according to the invention, it is configured so that the data length generated by the variable-length encoding is counted to obtain information of the data length, and the information of the data length is time-division-multiplexed with a variable-length encoded data and then transmitted. Therefore, it has an advantage that even if an error beyond the error correction capability occurs, the error does not propagate over blocks.

According to the invention, moreover, it is configured so that data of the number of the first ignoring bits of C1 block is time-division-multiplexed, and therefore it has an advantage that the data of the number of the ignoring bits can be readily recognized in a decoding process.

According to the invention, moreover, the data of the number of the first ignoring bits is recognized in a decoding process, and the decoding is performed with ignoring a data which is not to be variable-length encoded. It therefore has an advantage that the symbols can be prevented from being changed during the decoding process.

According to the invention, moreover, in a case where the variable-length code of one symbol is arranged so as to extend over a C1 block, a special code is inserted into the C1 block. Therefore, it has an advantage that there is no symbol change during the decoding process.

According to the invention, moreover, in a case where the variable-length code of one symbol is arranged so as to extend over a C1 block, the variable-length code of the symbol is arranged at the top of the next C1 block so that the code again begins from the leading bit. Therefore, it has an advantage that there is no symbol change during the decoding process.

According to the invention, moreover, a data which cannot accomplish the variable-length decoding at the end of a C1 block during the decoding process is not considered in the variable-length decoding process of the next C1 block, and therefore it has an advantage that the symbols can be prevented from being changed during the decoding process.

According to the invention, moreover, a data of a high compression ratio is again inserted during the encoding process into a prefixed position, and therefore it has an advantage that an important data is positioned at a location at which the reproduction is surely done during a special reproduction. Thus, only important data can be entirely reproduced in the special reproduction.

According to the invention, moreover, a mode in which only an important data is decoded is provided in the decoding. It therefore has an advantage that a reproduction image of excellent quality can be obtained even in a super high speed reproduction.

According to the invention, moreover, in an encoding where the orthogonal transform encoding is performed on a video signal or the like, when it is detected the succeeding data have a non-correctable error while the process fails to reach an EOB code, the data are not used and "O" is inserted and then the decoding is performed. Therefore, it has an advantage that the decoding can be performed without obtaining abnormal decoding results.

According to the invention, moreover, in an encoding where the orthogonal transform encoding is performed on a video signal or the like, when it is detected the succeeding data have a non-correctable error while the process fails to reach an EOB code, the data of the block are abandoned. Therefore, it has an advantage that the decoding can be performed without obtaining abnormal decoding results.

According to the invention, moreover, the sum of and the difference between the odd and even fields of one frame are obtained and then the encoding is performed. It therefore has an advantage that it is possible to perform the encoding with a higher compression ratio in most cases as compared with a case of encoding simply one frame. Furthermore, it is easy to conduct the editing operation in the unit of one frame.

According to the invention, moreover, when the S/N ratio of a video signal is poor, the encoding is performed with a rough quantizing bit number of the difference between fields in which the increase of the code amount is particularly remarkable or after conducting a noise reduction. Therefore, it has an advantage that the increase of the code amount caused by a noise is prevented from occurring.

According to the invention, moreover, it is configured so as to select one of a case in which the sum of fields and the difference between fields are obtained and the blocking is performed, a case in which the blocking is performed within a field, and a case in which the blocking is performed within a frame. It therefore has an advantage that the encode efficiency is always optimum.

According to the invention, moreover, either of the sum of fields and the difference between fields is quantized with a bit number smaller than that for the other of them by one bit, and its sign and parity are judged in the decoding process and decoded to respective field data. Therefore, it has an advantage that it is possible to perform the decoding with high-fidelity.

According to the invention, furthermore, it is configured so that the band division and the sum of fields and the difference between fields are used at the same time, and the more rough quantization is performed on the higher frequency components of the difference between fields. It therefore has an advantage that the compression ratio can be improved without detecting the deterioration in the visual sensation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A decoding apparatus for reproducing and decoding encoded data recorded on a recording medium, said encoded data including an error correction code and ignoring-bit-number data which is information of the number of bits after a partition used in an error-correction encoding added to the initial bit of variable-length encoded data, appended to a variable-length encoded data string partitioned by a predetermined length, said decoding apparatus comprising:

an error-correction decoder for error-correcting the reproduced encoded data;

an ignoring-bit-number data recognizing circuit for extracting the ignoring-bit-number data from the error-correction decoded data; and a variable-length decoder for executing variable-length decoding of the error-correction decoded variable-length encoded data on the basis of the extracted ignoring-bit-number data.

* * * * *